(12) United States Patent
Shiraishi et al.

(10) Patent No.: US 8,236,467 B2
(45) Date of Patent: Aug. 7, 2012

(54) EXPOSURE METHOD, EXPOSURE APPARATUS, AND DEVICE MANUFACTURING METHOD

(75) Inventors: Kenichi Shiraishi, Saitama (JP); Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 936 days.

(21) Appl. No.: 11/919,352

(22) PCT Filed: Apr. 28, 2006

(86) PCT No.: PCT/JP2006/309002
§ 371 (c)(1),
(2), (4) Date: Oct. 26, 2007

(87) PCT Pub. No.: WO2006/118258
PCT Pub. Date: Nov. 9, 2006

(65) Prior Publication Data
US 2009/0305150 A1 Dec. 10, 2009

(30) Foreign Application Priority Data
Apr. 28, 2005 (JP) ................ 2005-131866

(51) Int. Cl.
*G03C 5/00* (2006.01)
*G03B 27/32* (2006.01)
*G03B 27/52* (2006.01)

(52) U.S. Cl. ............ 430/30; 430/302; 430/322; 355/30; 355/67; 355/72; 355/77

(58) Field of Classification Search .............. 430/30, 430/302, 322; 355/30, 67, 72, 77
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,780,747 A | 10/1988 | Suzuki et al. | |
| RE32,795 E | 12/1988 | Matsuura et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |
| 5,969,441 A | 10/1999 | Loopstra et al. | |
| 5,995,234 A | 11/1999 | Nishi | |
| RE36,730 E | 6/2000 | Nishi | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,650,399 B2 | 11/2003 | Baselmans et al. | |
| 6,721,034 B1 | 4/2004 | Horikawa | |
| 6,721,039 B2 | 4/2004 | Ozawa | |
| 6,778,257 B2 | 8/2004 | Bleeker et al. | |
| 6,819,414 B1 | 11/2004 | Takeuchi | |
| 6,897,963 B1 | 5/2005 | Taniguchi | |
| 6,952,253 B2 | 10/2005 | Lof et al. | |
| 7,589,818 B2 | 9/2009 | Mulkens et al. | |
| 2002/0041377 A1 | 4/2002 | Hagiwara et al. | |
| 2002/0061469 A1 | 5/2002 | Tanaka | |
| 2003/0102017 A1 | 6/2003 | Taniyama | |
| 2004/0160582 A1 | 8/2004 | Lof et al. | |
| 2004/0165159 A1 | 8/2004 | Lof et al. | |
| 2004/0211920 A1 | 10/2004 | Maria Derksen et al. | |
| 2005/0036121 A1 | 2/2005 | Hoogendam et al. | |
| 2005/0046934 A1 | 3/2005 | Ho et al. | |
| 2005/0084794 A1 | 4/2005 | Meagley et al. | |
| 2005/0094114 A1 | 5/2005 | Streefkerk et al. | |
| 2005/0206868 A1 | 9/2005 | Kruijswijk et al. | |
| 2005/0217703 A1 | 10/2005 | O'Donnell | |
| 2005/0219488 A1 | 10/2005 | Nei et al. | |
| 2005/0225735 A1 | 10/2005 | Magome et al. | |
| 2005/0259232 A1 | 11/2005 | Streefkerk et al. | |
| 2005/0280791 A1 | 12/2005 | Nagasaka et al. | |
| 2006/0103821 A1 | 5/2006 | Hendricus Verspay et al. | |
| 2006/0238730 A1 | 10/2006 | Nei et al. | |
| 2006/0257553 A1 | 11/2006 | Ohta et al. | |
| 2007/0127006 A1 | 6/2007 | Shibazaki | |
| 2007/0291239 A1 | 12/2007 | Shiraishi | |
| 2008/0137056 A1 | 6/2008 | Fujiwara et al. | |
| 2009/0225286 A1 | 9/2009 | Nagasaka et al. | |

FOREIGN PATENT DOCUMENTS

| | | |
|---|---|---|
| DE | 221 563 A1 | 9/1983 |
| DE | 224 448 A1 | 7/1985 |
| EP | 1 420 298 A2 | 5/2004 |
| EP | 1519231 A1 | 3/2005 |
| EP | 1 571 694 A1 | 9/2005 |
| EP | 1 672 681 A1 | 6/2006 |
| EP | 1 713 113 A1 | 10/2006 |
| EP | 1 814 144 A1 | 8/2007 |
| EP | 1 833 082 A1 | 9/2007 |
| JP | A-57-117238 | 7/1982 |
| JP | A-58-202448 | 11/1983 |

(Continued)

OTHER PUBLICATIONS

Extended European Search Report issued in European Patent Application No. 06745861.2 on Dec. 28, 2009.

(Continued)

*Primary Examiner* — Christopher Young
(74) *Attorney, Agent, or Firm* — Oliff & Berridge, PLC

(57) ABSTRACT

An exposure method comprises: forming an immersion region on a substrate; exposing the substrate by irradiating the substrate with an exposure light via a liquid of the immersion region; and preventing an integration value of a contact time during which the liquid of the immersion region and a first region on the substrate are in contact, from exceeding a predetermined tolerance value.

34 Claims, 20 Drawing Sheets

FOREIGN PATENT DOCUMENTS

| | | |
|---|---|---|
| JP | A-59-019912 | 2/1984 |
| JP | A-62-065326 | 3/1987 |
| JP | A-62-183522 | 8/1987 |
| JP | A-63-157419 | 6/1988 |
| JP | A-04-065603 | 3/1992 |
| JP | A-04-65603 | 3/1992 |
| JP | A-04-305915 | 10/1992 |
| JP | A-04-305917 | 10/1992 |
| JP | A-05-21314 | 1/1993 |
| JP | A-05-062877 | 3/1993 |
| JP | A-06-124873 | 5/1994 |
| JP | A-07-220990 | 8/1995 |
| JP | A-08-130179 | 5/1996 |
| JP | A 8-166475 | 6/1996 |
| JP | A-08-316125 | 11/1996 |
| JP | A 8-330224 | 12/1996 |
| JP | A 09-042832 | 2/1997 |
| JP | A 10-116806 | 5/1998 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-16816 | 1/1999 |
| JP | A-11-135400 | 5/1999 |
| JP | A-11-176727 | 7/1999 |
| JP | A-2000-058436 | 2/2000 |
| JP | A-2000-505958 | 5/2000 |
| JP | A-2000-164504 | 6/2000 |
| JP | A-2001-510577 | 7/2001 |
| JP | A-2001-267239 | 9/2001 |
| JP | A-2002-14005 | 1/2002 |
| JP | A-2002-71514 | 3/2002 |
| JP | A 2002-134461 | 5/2002 |
| JP | A-2002-198303 | 7/2002 |
| JP | A 2003-168668 | 6/2003 |
| JP | A 2004-101130 | 4/2004 |
| JP | A 2004-119717 | 4/2004 |
| JP | A-2004-519850 | 7/2004 |
| JP | 2004-289128 A | 10/2004 |
| JP | A-2004-289126 | 10/2004 |
| JP | A 2004-319724 | 11/2004 |
| JP | A-2005-175433 | 6/2005 |
| JP | A-2006-140494 | 6/2006 |
| WO | WO 99/23692 | 5/1999 |
| WO | WO 99/23692 A1 | 5/1999 |
| WO | WO 99/28790 A1 | 6/1999 |
| WO | WO 99/49504 A1 | 9/1999 |
| WO | WO 99/60361 A1 | 11/1999 |
| WO | WO 01/35168 | 5/2001 |
| WO | WO 2004/019128 A2 | 3/2004 |
| WO | WO 2004/053952 | 6/2004 |
| WO | WO 2004/053953 A1 | 6/2004 |
| WO | WO 2004/055803 | 7/2004 |
| WO | WO 2004/057589 A1 | 7/2004 |
| WO | WO 2004/057590 | 7/2004 |
| WO | WO 2004/086468 A1 | 10/2004 |
| WO | WO 2004/090577 A2 | 10/2004 |
| WO | WO 2005/029559 | 3/2005 |
| WO | WO 2005/029559 A1 | 3/2005 |
| WO | WO 2005/036621 | 4/2005 |
| WO | WO 2005/074014 A1 | 8/2005 |
| WO | WO 2006/118258 A1 | 11/2006 |

OTHER PUBLICATIONS

Office Action issued in U.S. Appl. No. 11/792,054 on Oct. 1, 2009.
Office Action issued in U.S. Appl. No. 11/792,054 on Jul. 8, 2010.
Office Action issued in U.S. Appl. No. 11/792,054 on Nov. 26, 2010.
Office Action issued in Israeli Patent Application No. 186919 on Apr. 11, 2010 (w/Partial English Translation).
Office Action issued in Singapore Patent Application No. 200717229-9 on Jul. 9, 2008.
Notice of Allowance issued in Singapore Patent Application No. 200717229-9 on Mar. 17, 2009.
International Search Report issued in PCT/JP2006/309002 on Jul. 25, 2006 (w/English Translation).
Written Opinion of the International Searching Authority issued in PCT/JP2006/309002 on Jul. 25, 2006 (w/English Translation).
Office Action issued on Apr. 26, 2011 in Japanese Patent Application No. 2007-514839 with English translation.
Extended European Search Report issued in EP Application No. 05814663.0 on Feb. 19, 2010.
Jan. 10, 2006 International Search Report issued in International Application No. PCT/JP2005/022326.
Jan. 17, 2006 International Search Report issued in International Application No. PCT/JP2005/022329.
Jan. 17, 2011 Office Action issued in copending Israeli Patent Application No. 186919 with translation.
Feb. 7, 2012 Office Action issued in EP Application No. 06745861.2.
Mar. 27, 2012 Office Action issued in Japanese Application No. 2007-514839 (with translation).

EXPOSURE METHOD, EXPOSURE APPARATUS, AND DEVICE MANUFACTURING METHOD

TECHNICAL FIELD

The present invention relates to an exposure method, an exposure apparatus, and a device manufacturing method, with which a substrate is exposed via a liquid.

Priority is claimed on Japanese Patent Application No. 2005-131866, filed Apr. 28, 2005, the content of which is incorporated herein by reference.

BACKGROUND ART

In a photolithography process, which is a manufacturing process for micro-devices (electronic devices etc.), such as liquid crystal display devices and the like, an exposure apparatus is used which projects and exposes a pattern, formed on a mask, onto a photosensitive substrate. This exposure apparatus includes a mask stage that holds the mask and a substrate stage that holds the substrate, and the exposure apparatus projects and exposes the pattern of the mask onto the substrate via a projection optical system while successively moving the mask stage and the substrate stage. In the manufacture of a micro-device, the pattern formed on the substrate must be made fine in order to increase the density of the device. To address this need, even higher resolution of the exposure apparatus is desired. As a means for realizing this higher resolution, there is proposed a liquid immersion exposure apparatus as disclosed in Patent Document 1, in which an immersion region of a liquid is formed on a substrate and the substrate is exposed via the liquid of the immersion region.

Patent Document 1: PCT International Patent Publication No. WO 99/49504

DISCLOSURE OF INVENTION

Problems to be Solved by the Invention

However, with the immersion exposure apparatus, the liquid may apply influences on the substrate through contact of the liquid with the substrate, and the forming of a desired pattern on the substrate may be disabled by these influences. Also, as disclosed in European Patent Publication No. 1519231, pattern sizes (line widths, etc.) may depend on the duration of contact with the liquid.

A purpose of some aspects of the invention is to provide an exposure method, an exposure apparatus, and a device manufacturing method that enable a predetermined pattern to be formed on a substrate even when a liquid immersion method is employed.

Means for Solving the Problem

According to a first aspect of the present invention, there is provided an exposure method, including: forming an immersion region on a substrate; exposing the substrate by irradiating the substrate with an exposure light via a liquid of the immersion region; and preventing an integration value of a contact time during which the liquid of the immersion region and a first region on the substrate are in contact, from exceeding a predetermined tolerance value.

According to the first aspect of the present invention, by preventing the integration value of the contact time during which the liquid of the immersion region and a first region on the substrate are in contact, from exceeding the predetermined tolerance value, a predetermined pattern can be formed on the substrate even if the liquid contacts the substrate.

According to a second aspect of the present invention, there is provided an exposure method, including: forming an immersion region on the substrate; exposing the substrate via a liquid of the immersion region; and preventing a stationary time during which at least a portion of the immersion region is stationary on the substrate, from exceeding a predetermined tolerance value.

According to the second aspect of the present invention, by preventing the stationary time during which at least a portion (edge, etc.) of the immersion region is stationary on the substrate, from exceeding the predetermined tolerance value, a predetermined pattern can be formed on the substrate even if the liquid contacts the substrate.

According to a third aspect of the present invention, there is provided a device manufacturing method that employs the exposure method of either of the above-described aspects.

According to the third aspect of the present invention, degradation of a pattern formed on the substrate can be suppressed to manufacture a device of a desired performance.

According to a fourth aspect of the present invention, there is provided an exposure apparatus that exposes a substrate via an immersion region, including: an immersion mechanism that forms the immersion region; and a control apparatus that prevents an integration value of a contact time during which a liquid of the immersion region and a predetermined region on the substrate are in contact, from exceeding a predetermined tolerance value.

According to the fourth aspect of the present invention, by preventing the integration value of the contact time during which the liquid of the immersion region and a predetermined region on the substrate are in contact, from exceeding the predetermined tolerance value, a predetermined pattern can be formed on the substrate even if the liquid contacts the substrate.

According to a fifth aspect of the present invention, there is provided an exposure apparatus for exposing a substrate via an immersion region, including: an immersion mechanism that forms the immersion region; and a control apparatus that prevents a stationary time during which at least a portion of the immersion region is stationary on the substrate, from exceeding a predetermined tolerance value.

According to the fifth aspect of the present invention, by preventing the stationary time during which at least a portion (edge, etc.) of the immersion region is stationary on the substrate, from exceeding the predetermined tolerance value, a predetermined pattern can be formed on the substrate even if the liquid contacts the substrate.

According to a sixth aspect of the present invention, there is provided a device manufacturing method that employs the exposure apparatus of either of the above-described aspects.

According to the sixth aspect of the present invention, degradation of a pattern formed on the substrate can be suppressed to manufacture a device of a desired performance.

BEST MODE FOR CARRYING OUT THE INVENTION

Hereunder is a description of embodiments of the present invention with reference to the drawings. However, the present invention is not limited to this description.

First Embodiment

Figure 1:
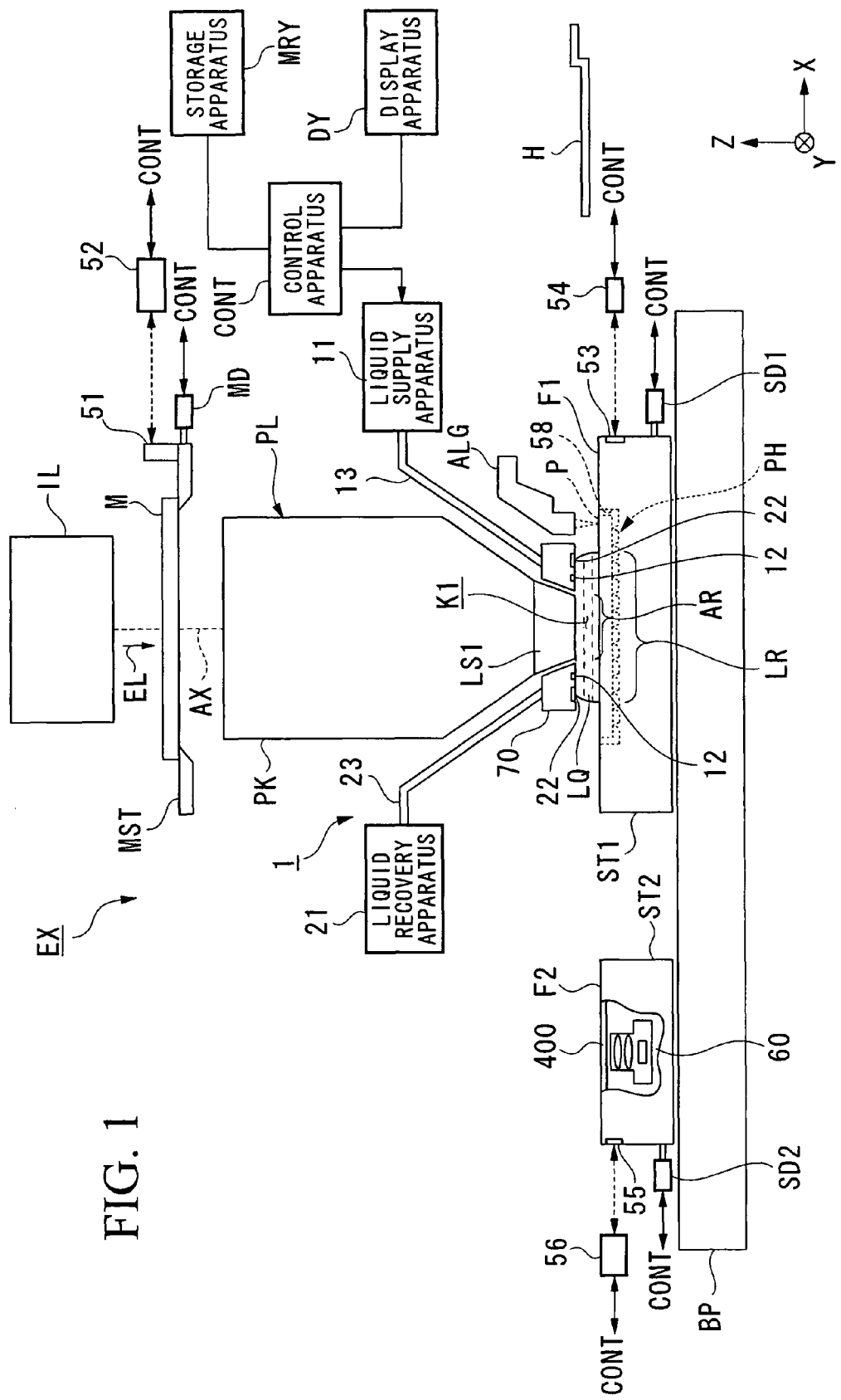
FIG. 1 is a schematic block diagram showing an embodiment of an exposure apparatus.

FIG. 1 is a schematic block diagram showing an embodiment of an exposure apparatus EX. In FIG. 1, the exposure apparatus EX includes: a mask stage MST, capable of holding and moving a mask M; a substrate stage ST1, capable of moving while holding a substrate P; a measurement stage ST2, capable of moving while carrying at least a portion of a measuring instrument for making measurements related to an exposure process; an illumination optical system IL for illuminating an exposure light EL onto the mask M on the mask stage MST; a projection optical system PL for projecting a pattern image of the mask M, illuminated by the exposure light EL, onto the substrate P on the substrate stage ST1; and a control apparatus CONT for controlling operations of the entire exposure apparatus EX. A storage apparatus MRY, storing information related to the exposure process, and a display apparatus DY, displaying information related to the exposure process, are connected to the control apparatus CONT. The substrate stage ST1 and the measurement stage ST2 are respectively movable independent of each other on a base member BP at an image plane side of the projection optical system PL. The exposure apparatus EX further includes a conveying apparatus H that transfers the substrate P, in other words, loads the substrate P onto the substrate stage ST1 and unloads the substrate P from the substrate stage ST1. Although the loading and unloading of the substrate P may be performed at different positions, in the present embodiment, the loading and unloading of the substrate P are performed at the same position (RP).

The exposure apparatus EX of the present embodiment is an immersion exposure apparatus applicable to an immersion method for substantially shortening the exposure wavelength and thereby improving the resolution and also, substantially expanding the depth of focus, and includes at least: an immersion mechanism 1 that fills an optical path space K1 of the exposure light EL, between at least a final optical element LS1, which, among a plurality of optical elements constituting the projection optical system PL, is closest to the image plane of the projection optical system PL, and an object (at least a portion of the substrate P, the substrate stage ST1, and the measurement stage ST2), disposed at the image plane side of the projection optical system PL, with a liquid LQ to make this optical path space K1 of the exposure light EL an immersed space and thereby forming an immersion region LR of the liquid LQ on the object. Operations of the immersion mechanism 1 are controlled by the control apparatus CONT.

The immersion mechanism 1 includes: a nozzle member 70, disposed near the image plane of the projection optical system PL and having supply ports 12, for supplying the liquid LQ, and collection ports 22, for recovering the liquid LQ; a liquid supply apparatus 11 for supplying the liquid LQ to the image plane side of the projection optical system PL via a supply pipe 13 and the supply ports 12 provided in the nozzle member 70; and a liquid recovery apparatus 21 for recovering the liquid LQ at the image plane side of the projection optical system PL via the collection ports 22, provided in the nozzle member 70, and a recovery pipe 23.

Although in the description that follows, a case where the immersion region LR is formed on a portion of the substrate P may be described, the immersion region LR is formed on an object, disposed at a position opposite the final optical element LS1 and at the image plane side of the projection optical system PL, in other words, on at least a portion of the substrate P, an upper surface F1 of the substrate stage ST1, and an upper surface F2 of the measurement stage ST2.

In the present embodiment, the exposure apparatus EX adopts a local liquid immersion method where the immersion region LR of the liquid LQ, which is greater than a projection region AR of the projection optical system PL and smaller than the substrate P, is formed locally on a partial region on the substrate P that includes the projection region AR. The exposure apparatus EX uses the immersion mechanism 1 to fill the optical path space K1 of the exposure light EL, between the final optical element LS1, closest to the image plane of the projection optical system PL, and the substrate P, disposed at the image plane side of the projection optical system PL, with the liquid LQ to locally form the immersion region LR of the liquid LQ on a partial region on the substrate P at least while the pattern image of the mask M is being projected onto the substrate P and illuminates the exposure light EL, which has passed through the mask M, via the projection optical system PL and the liquid LQ to project and expose the pattern image of the mask M onto the substrate P. By using the liquid supply apparatus 11 of the immersion mechanism 1 to supply a predetermined amount of the liquid LQ and using the liquid recovery apparatus 21 to recover a predetermined amount of the liquid LQ, the control apparatus CONT fills the optical path space K1 with the liquid LQ and locally forms the immersion region LR of the liquid LQ on a partial region of the substrate P. The immersion region LR, formed by the liquid LQ filled in the optical path space K1, is formed along the optical path of the exposure light EL.

With the present embodiment, a case where a scan type exposure apparatus (so-called scanning stepper), which exposes the pattern, formed on the mask M, onto the substrate P while synchronously moving the mask M and the substrate P, is used as the exposure apparatus EX shall be described as an example. In the following description, a direction of synchronous movement (scan direction) of the mask M and the substrate P within a horizontal plane shall be referred to as the Y-axis direction, a direction (non-scan direction) orthogonal to the Y-axis direction in the horizontal plane shall be referred to as the X-axis direction, and a direction orthogonal to both the X-axis direction and the Y-axis direction (in the present example, a direction parallel to an optical axis AX of the projection optical system PL) shall be referred to as the Z-axis direction. Furthermore, rotation (inclination) directions about the X-axis, the Y-axis and the Z-axis shall be referred to as the θX, the θY, and the θZ directions, respectively. In the present description, "substrate" refers inclusively to semiconductor wafers and other substrates on which a photosensitive material (resist), protective film, or other film has been coated. "Mask" refers inclusively to reticles, having device patterns, to be reduction-projected onto the substrate, formed thereon.

The illumination optical system IL includes: an exposure light source that emits the exposure light EL; an optical integrator that makes uniform the luminance of the exposure light EL emitted from the exposure light source; a condenser lens that converges the exposure light EL from the optical integrator; a relay lens system; a field stop that sets an illumination region of the exposure light EL on the mask M; etc. The illumination optical system IL illuminates the predetermined illumination region on the mask M with the exposure light EL of a uniform luminance distribution. As the exposure light EL emitted from exposure light source IL, for example, emission lines (g line, h line, i line) emitted, for example, from a mercury lamp, deep ultraviolet light (DUV light), such as KrF excimer laser light (wavelength: 248 nm), or vacuum ultraviolet light (VUV light), such as ArF excimer laser light (wavelength: 193 nm) or $F_2$ laser light (wavelength: 157 nm), is used. In this embodiment, ArF excimer laser light is used.

In the present embodiment, pure water is used as the liquid LQ supplied from the liquid supply apparatus 11. Pure water can transmit not only ArF excimer laser light but can also, transmit, for example, the emission lines (g line, h line, i line) emitted from a mercury lamp and deep ultraviolet light (DUV light), such as KrF excimer laser light (wavelength: 248 nm).

The mask stage MST can move while holding the mask M. The mask stage MST holds the mask M, for example, by vacuum suction. The mask stage MST is movable two-dimensionally within a plane perpendicular to the optical axis AX of the projection optical system PL, that is, within the X-Y plane, and is micro-rotatable in the θZ direction. The mask stage MST is driven by a mask stage drive apparatus MD that includes a linear motor, etc. The mask stage drive apparatus MD is controlled by the control apparatus CONT. A movement mirror 51 is disposed on the mask stage MST. Also, a laser interferometer 52 is disposed at a predetermined position. The position in the two-dimensional directions and the rotation angle in the θZ direction (and, in some cases, the rotation angles in the θX and θY directions) of the mask M on the mask stage MST are measured in real time by the laser interferometer 52 using the movement mirror 51. The measurement results of the laser interferometer 52 are output to the control apparatus CONT. The control apparatus CONT drives the mask stage drive apparatus MD based on the measurement results of the laser interferometer 52 to perform positional control of the mask M held on the mask stage MST.

The movement mirror 51 may not only be a plane mirror but may also, be a corner cube (retroreflector), and instead of fixing the movement mirror 51 on the mask stage MST, for example, a reflecting surface, formed by mirror polishing an end face (side face) of the mask stage MST, may be used. Furthermore, the mask stage MST may be of an arrangement capable of coarse/fine movement as disclosed for example in Japanese Unexamined Patent Application Publication No. H08-130179 (corresponding U.S. Pat. No. 6,721,034).

The projection optical system PL projects the pattern image of the mask M onto the substrate P at a predetermined projection magnification β, and has a plurality of optical elements, and these optical elements are held in a lens barrel PK. In the present embodiment, the projection optical system PL is a reduction system with a projection magnification β, for example, of ¼, ⅕, or ⅛, and forms a reduced image of the mask pattern on the projection region AR that is conjugate to the aforementioned illumination region. The projection optical system PL may be a reduction system, an equal-size magnification system, or a magnification system. Furthermore, the projection optical system PL may be any one of: a refractive system that does not include a reflection optical element, a reflection system that does not include a refractive optical element, or a catadioptric system that includes a reflection optical element and a refractive optical element. In the present embodiment, of the plurality of optical elements constituting the projection optical system PL, only the final optical element LS1, which is closest to the image plane of the projection optical system PL, makes contact with the liquid LQ supplied to the optical path space K1.

The substrate stage ST1 has a substrate holder PH for holding the substrate P, and is capable of moving while holding the substrate P on the substrate holder PH. The substrate holder PH holds the substrate P, for example, by vacuum suction. A recess portion 58 is provided on the substrate stage ST1, and the substrate holder PH for holding the substrate P is disposed in the recess portion 58. The upper surface F1 of the substrate stage ST1 other than the recess portion 58 is a flat surface of approximately the same height as (flush with) a top surface of the substrate P, which is held by the substrate holder PH. This is because, for example, a portion of the immersion region LR may protrude beyond the top surface of the substrate P and be formed on the upper surface F1 during the exposure operation of the substrate P. Just a portion of the upper surface F1 of the substrate stage ST1, for example, a predetermined region surrounding the substrate P (and including the range of protrusion of the immersion region LR), may be made approximately the same in height as the top surface of the substrate P. Furthermore, if the optical path space K1 on the image plane side of the projection optical system PL can be kept filled with the liquid LQ (that is, if the immersion region LR can be maintained favorably), then there may be a step between the top surface of the substrate P, which is held by the substrate holder PH, and the upper surface F1 of the substrate stage ST1. Furthermore, although the substrate holder PH may be formed integral to a portion of the substrate stage ST1, in the present embodiment, the substrate holder PH and the substrate stage ST1 are arranged separately, and the substrate holder PH is secured in the recess portion 58, for example, by vacuum suction.

By being driven by a substrate stage drive apparatus SD1, which includes a linear motor, etc., controlled by the control apparatus CONT, the substrate stage ST1 can move two-dimensionally within the X-Y plane and micro-rotate in the $\theta Z$ direction on the base member BP while holding the substrate P via the substrate holder PH. The substrate stage ST1 can furthermore move in the Z-axis direction, the $\theta X$ direction, and the $\theta Y$ direction. The top surface of the substrate P held by the substrate stage ST1 is thus moveable in the directions of six degrees of freedom of: the X-axis, Y-axis, Z-axis, $\theta X$, $\theta Y$ and $\theta Z$ directions. A movement mirror 53 is disposed on a side face of the substrate stage ST1. Also, a laser interferometer 54 is disposed at a predetermined position. The position in two-dimensional directions and the rotation angles of the substrate P on the substrate stage ST1 are measured in real time by the laser interferometer 54 using the movement mirror 53. Also, although unillustrated, the exposure apparatus EX has a focus leveling detection system that detects planar position information of the top surface of the substrate P held by the substrate stage ST1.

The measurement results of the laser interferometer 54 are output to the control apparatus CONT. The detection results of the focus leveling detection system are also, output to the control apparatus CONT. The control apparatus CONT drives the substrate stage drive apparatus SD1 based on the detection results of the focus leveling detection system to control a focus position (Z position) and inclination angles ($\theta X$, $\theta Y$) of the substrate P to thereby adjust the positional relationship of the top surface of the substrate P and the image plane, formed via the projection optical system PL and the liquid LQ, and drives the substrate stage drive apparatus SD1 based on the measurement results of the laser interferometer 54 to perform positional control of the substrate P in the X-axis direction, Y-axis direction, and $\theta Z$ direction.

The laser interferometer 54 may also, be capable of measuring the position of the substrate stage ST1 in the Z-axis direction and the rotation information in the OX and the $\theta Y$ directions, and further details thereof are disclosed, for example, in Japanese Translation No. 2001-510577 of PCT International Publication (corresponding PCT International Publication No. WO 1999/28790). Furthermore, instead of fixing the movement mirror 53 to the substrate stage ST1, for example, a reflecting surface, formed by mirror polishing a portion (side face, etc.) of the substrate stage ST1, may be used.

Also, the focus leveling detection system detects inclination information (rotation angles) in the $\theta X$ and $\theta Y$ directions of the substrate P by measuring Z-axis direction position information of the substrate P at a plurality of measurement points, and at least a portion of the plurality of measurement points may be set within the immersion region LR (or the projection region AR), or all of the measurement points may be set outside the immersion region LR. Furthermore, when for example the laser interferometer 54 is capable of measuring the position information in the Z-axis, $\theta X$, and $\theta Y$ directions of the substrate P, the focus leveling detection system does not have to be provided to enable measurement of the Z-axis direction position information of the substrate P during the exposure operation, and arrangements may be made to perform positional control of the substrate P in regard to Z-axis, $\theta X$, and $\theta Y$ directions using the measurement results of the laser interferometer 54 at least during the exposure operation.

The measurement stage ST2 has installed thereon various measuring instruments (including measuring members) for making measurements related to the exposure process and is movably disposed on the base member BP at the image plane side of the projection optical system PL. The measurement stage ST2 is driven by a measurement stage drive apparatus SD2. The measurement stage drive apparatus SD2 is controlled by the control apparatus CONT. The control apparatus CONT can move each of the substrate stage ST1 and the measurement stage ST2 independently of each other on the base member BP via the stage drive apparatuses SD1 and SD2, respectively. The measurement stage drive apparatus SD2 has an arrangement equivalent to the substrate stage drive apparatus SD1, and like the substrate stage ST1, the measurement stage ST2 is enabled to move in each of the X-axis, Y-axis, Z-axis, $\theta X$, $\theta Y$, and $\theta Z$ directions by the measurement stage drive apparatus SD2. Also, a movement mirror 55 is disposed on a side face of the measurement stage ST2, and a laser interferometer 56 is disposed at a predetermined position. The position in two-dimensional directions and the rotation angles of the measurement stage ST2 are measured in real time by the laser interferometer 56 using the movement mirror 55, and the control apparatus CONT controls the position of the measurement stage ST2 based on the measurement results of the laser interferometer 56. The laser interferometer 56 may also, be arranged to be capable of measuring the Z-axis direction position and the $\theta X$ and $\theta Y$ direction rotation information of the measurement stage ST2. Also, instead of fixing the movement mirror 55 to the measurement stage ST2, for example, a reflecting surface, formed by mirror polishing a portion (side face, etc.) of the measurement stage ST2, may be used.

As examples of the measuring instruments installed on the measurement stage ST2, a reference mark plate, having a plurality of reference marks formed thereon, such as disclosed in Japanese Unexamined Patent Application Publication No. H05-21314 (corresponding U.S. Pat. No. RE36,730), a non-uniformity sensor for measuring non-uniformity of illuminance, such as disclosed in Japanese Unexamined Patent Application Publication No. S57-117238 (corresponding U.S. Pat. No. RE32,795), a non-uniformity sensor for measuring variation of transmittance of the exposure light EL of the projection optical system PL, such as disclosed in Japanese Unexamined Patent Application Publication No. 2001-267239 (corresponding U.S. Pat. No. 6,721,039), an aerial image measurement sensor, such as disclosed in Japanese Unexamined Patent Application Publication No. 2002-14005 and Japanese Unexamined Patent Application Publication No. 2002-198303 (corresponding U.S. Patent Application Publication No. 2002/0041377A1), and an illumination amount sensor (illuminance sensor), such as disclosed in Japanese Unexamined Patent Application Publication No. H11-16816 (corresponding U.S. Patent Application Publication No. 2002/0061469A1), can be cited. A wavefront aberration measuring apparatus, such as disclosed in PCT International Patent Publication No. WO 99/60361 (corresponding U.S. Pat. No. 6,819,414), Japanese Unexamined Patent Application Publication No. 2002-71514, U.S. Pat. No. 6,650,399, etc., a reflection unit, such as disclosed in Japanese Unexamined Patent Application Publication No. S62-183522 (corresponding U.S. Pat. No. 4,780,747), etc., can also, be cited as examples of the measuring instruments installed on the measurement stage ST2. The measurement stage ST2 is thus a dedicated stage for performing a measurement process related to the exposure process and is configured so as not to hold the substrate P, and the substrate stage ST1 is configured so as not to have measuring instruments for performing measurements related to the exposure process installed thereon. An exposure apparatus that includes such a measurement stage is disclosed in more detail, for example, in Japanese Unexamined Patent Application Publication No. H11-135400 (corresponding PCT International Patent Publication No. WO 1999/23692), Japanese Unexamined Patent Application Publication No. 2000-164504 (corresponding U.S. Pat. No. 6,897,963), etc. In the present embodiment, an observation apparatus for observing the state of the immersion region LR is also, installed on the measurement stage ST2.

Not all of the abovementioned measuring instruments need to be installed on the measurement stage ST2 and just a portion of the measuring instruments may be installed as needed. Furthermore, a portion of the measuring instruments necessary for the exposure apparatus EX may be installed on the measurement stage ST2 and the remaining portion may be installed on the substrate stage ST1. Also, just a portion of the respective measuring instruments mentioned above may be installed on the measurement stage ST2 or the substrate stage ST1 and the remaining portion may be disposed externally or on another member.

Near a front end of the projection optical system PL is disposed an off-axis type alignment system ALG that detects an alignment mark on the substrate P, a reference mark on a reference mark plate disposed on the measurement stage ST2, etc. With the alignment system ALG of the present embodiment, as disclosed in for example Japanese Unexamined Patent Application Publication No. H04-65603 (corresponding to U.S. Pat. No. 5,995,234), an FIA (field image alignment) method is employed whereby a broadband detection light, which does not photosensitize the photosensitive material on the substrate P, is illuminated onto an object mark, an image of the object mark, formed on a light receiving surface by reflected light from the object mark, and an image of an unillustrated index (an index pattern on a index plate disposed inside the alignment system ALG) are captured using an image pickup device (CCD, etc.), and the position of the mark is measured by image processing the image pickup signals. In the present embodiment, the alignment system ALG can detect the alignment mark on the substrate P and the reference mark on the reference mark plate without intervention of the liquid LQ.

The immersion mechanism 1 shall now be described. The liquid supply apparatus 11 of the immersion mechanism 1 supplies the liquid LQ to fill the optical path space K1 at the light emitting side of the final optical element LS1 and includes a tank for containing the liquid LQ, a pressurizing pump, a temperature adjustment apparatus for adjusting the temperature of the liquid LQ to be supplied, a degasifier for reducing gas components inside the liquid LQ to be supplied, a filter unit for removing foreign matter in the liquid LQ, etc. One end of the supply pipe 13 is connected to the liquid supply apparatus 11, and the other end of the supply pipe 13 is connected to the nozzle member 70. The liquid supplying operation of the liquid supply apparatus 11 is controlled by the control apparatus CONT. The exposure apparatus EX does not have to be equipped with all of the tank, pressurizing pump, temperature adjustment apparatus, degasifier, filter unit, etc., of the liquid supply apparatus 11, and equipment of a plant, etc., in which the exposure apparatus EX is installed, may be used in place of any of these components.

The liquid recovery apparatus 21 of the immersion mechanism 1 is for recovering the liquid LQ filled in the optical path space K1 at the light emitting side of the final optical element LS1, and includes a vacuum system, such as a vacuum pump, etc., a gas/liquid separator for separating the recovered liquid LQ and gas, a tank for containing the recovered liquid LQ, etc. One end of the recovery pipe 23 is connected to the liquid recovery apparatus 21, and the other end of the recovery pipe 23 is connected to the nozzle member 70. The liquid recovery operation of the liquid recovery apparatus 21 is controlled by the control apparatus CONT. The exposure apparatus EX does not have to be equipped with all of the vacuum system, gas/liquid separator, tank, etc., of the liquid recovery apparatus 21, and equipment of a plant, etc., in which the exposure apparatus EX is installed, may be used in place of any of these components.

The supply ports 12 for supplying the liquid LQ and the collection ports 22 for recovering the liquid LQ are formed on a bottom surface of the nozzle member 70. The bottom surface of the nozzle member 70 is set practically parallel to the X-Y plane, opposes the projection optical system PL (final optical element LS1), and the position thereof is set so that when the substrate stage ST1 (or the measurement stage ST2) is positioned, a predetermined gap is formed with respect to either or both of the upper surface F1 and the top surface of the substrate P (or the upper surface F2). The nozzle member 70 is an annular member that is disposed so as to surround a side face of at least one optical element (the final optical element LS1 in the present example) disposed at the image plane side of the projection optical system PL, and the plurality of supply ports 12 are disposed at the bottom surface of the nozzle member 70 so as to surround the optical path space K1. The collection ports 22 are disposed at the outer side of (and away from) the supply ports 12 with respect to the optical path space K1 at the bottom surface of the nozzle member 70 and are disposed in an annular manner so as to surround the optical path space K1 (final optical element LS1) and the supply ports 12. Porous members are provided in the collection ports 22 of the present embodiment. Each porous member is constituted, for example, of a porous ceramic body or a plate-like mesh made of titanium or stainless steel (for example, SUS 316).

The control apparatus CONT supplies a predetermined amount of the liquid LQ by means of the liquid supply apparatus 11 of the immersion mechanism 1 and recovers a predetermined amount of the liquid LQ using the liquid recovery apparatus 21 of the immersion mechanism 1 to fill the optical path space K1 with the liquid LQ and thereby locally form the immersion region LR of the liquid LQ. In forming the immersion region LR of the liquid LQ, the control apparatus CONT drives each of the liquid supply apparatus 11 and the liquid recovery apparatus 21 of the immersion mechanism 1. When the liquid LQ is fed out from the liquid supply apparatus 11 under the control of the control apparatus CONT, the liquid LQ fed out from the liquid supply apparatus 11 flows through the supply pipe 13 and is thereafter supplied, via a supply passage (internal passage), formed in the interior of the nozzle member 70, and from the supply ports 12, to the optical path space K1 at the image plane side of the projection optical system PL. Also, when the liquid recovery apparatus 21 is driven under the control of the control apparatus CONT, the liquid LQ, in the optical path space K1 at the image plane side of the projection optical system PL flows via the collection ports 22 into a recovery passage (internal passage), formed in the interior of the nozzle member 70, and, after flowing through the recovery pipe 23 is recovered in the liquid recovery apparatus 21.

The embodiment of the immersion mechanism 1 (immersion space forming member) that includes the nozzle member 70 is not restricted to that described above and, for example, a nozzle member disclosed in PCT International Patent Publication No. WO 2004/086468 (corresponding U.S. Patent Application Publication No. 2005/0280791A1), Japanese Unexamined Patent Application Publication No. 2004-289126 (corresponding U.S. Pat. No. 6,952,253), etc., may be used instead. Specifically, although in the present embodiment, the bottom surface of the nozzle member 70 is set at substantially the same height (Z position) as the bottom surface (light emitting surface) of the projection optical system PL, the bottom surface of the nozzle member 70 may, for example, be set at the image plane side (substrate side) of the lower end surface of the projection optical system PL instead. In this case, a portion (bottom end) of the nozzle member 70 may be disposed so as to extend below the bottom side of the projection optical system PL (the final optical element LS1) so as not to obstruct the exposure light EL. Also, although in the present embodiment, the supply ports 12 are provided on the bottom surface of the nozzle member 70, the supply ports 12 may instead be provided, for example, on inner faces (inclined faces) of the nozzle member 70 that oppose the side face of the final optical element LS1 of the projection optical system PL.

Figure 2:
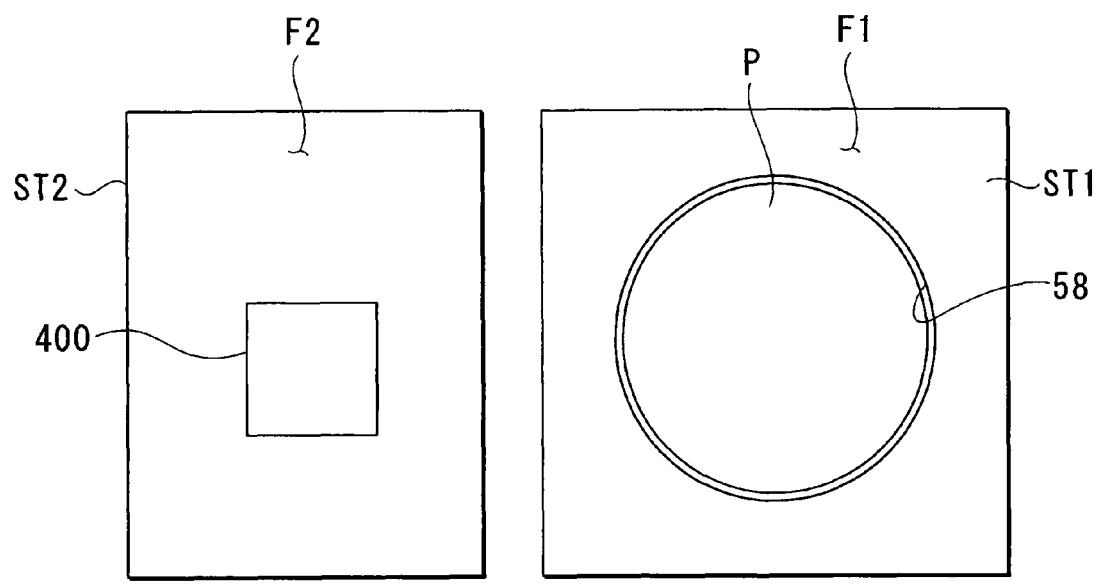
FIG. 2 is a view from above of a substrate stage and a measurement stage.

FIG. 2 is a plan view of the substrate stage ST1 and the measurement stage ST2 as viewed from above. To simplify the description, only an upper plate 400 that constitutes a portion of an aerial image measurement sensor is shown on the measurement stage ST2 in FIG. 2.

The aerial image measurement sensor is used to measure image forming characteristics (optical characteristics) of the projection optical system PL in the state in which the optical path space K1 is filled with the liquid LQ, and includes the upper plate 400, disposed on the measurement stage ST2, a light receiving element (optical sensor, not shown in the figures) constituted of a photoelectric conversion element, an optical system (not shown in the figures), which introduces light that has passed through the upper plate 400 to the light receiving element, etc.

An upper surface of the upper plate 400 of the spatial image measurement sensor is substantially flush with the upper surface of the measurement stage ST2. In the description that follows, the upper surface of the measurement stage ST2, including the upper surface of the upper plate 400 of the spatial image measurement sensor, shall be referred to as the "upper surface F2" where suitable. Preferably, the upper surface F2 of the measurement stage ST2 exhibits liquid repellency against the liquid LQ2.

Figure 3:
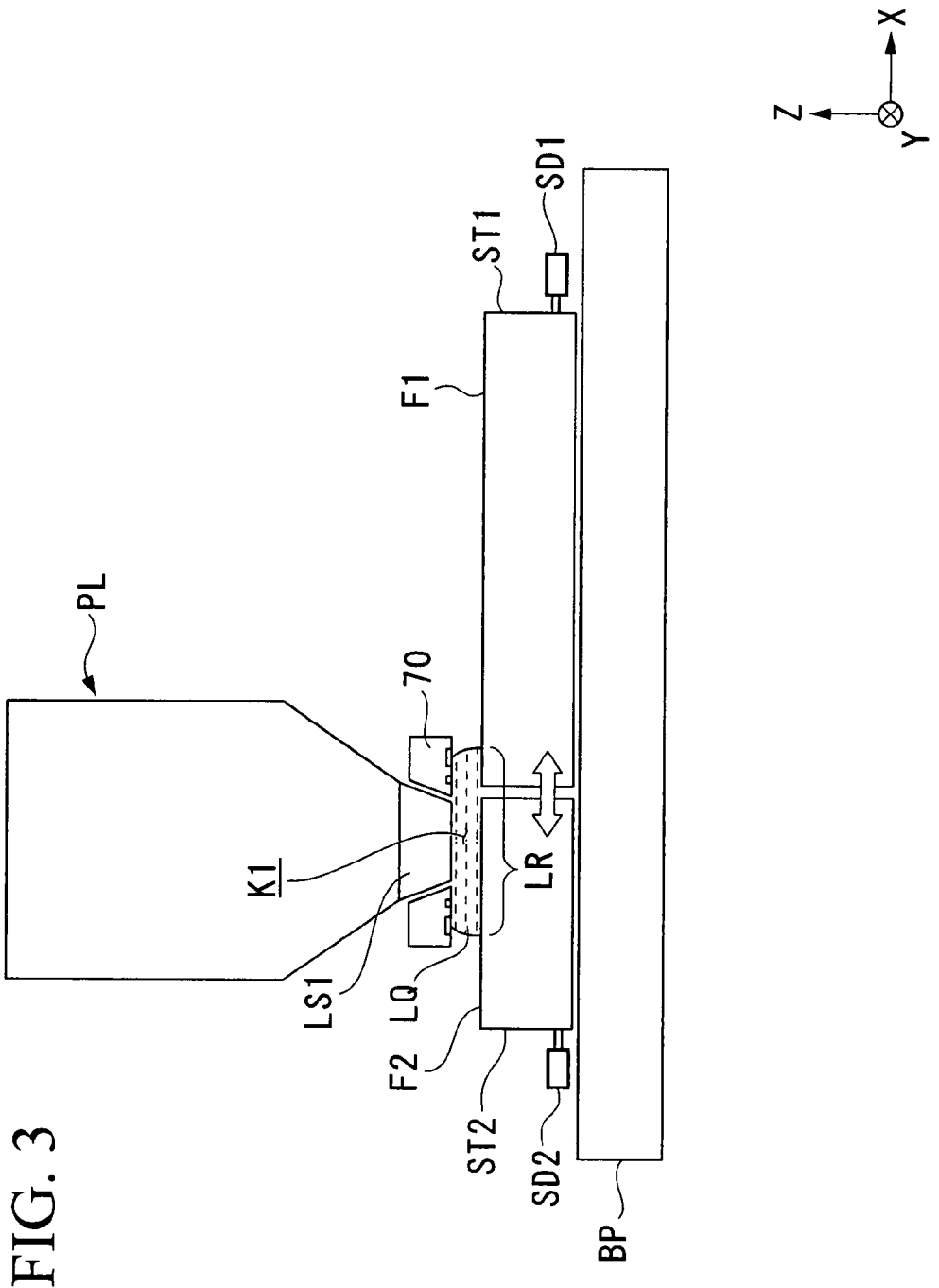
FIG. 3 is a diagram showing a manner in which an immersion region moves on the substrate stage and the measurement stage.

As shown in FIG. 3, the control apparatus CONT can bring the substrate stage ST1 and the measurement stage ST2 in contact with or close to each other, and can control (adjust) the upper surface F1 of the substrate stage ST1 and the upper surface F2 of the measurement stage ST2 to be at substantially the same height position by driving, for example, at least one of either of the stages ST1 and ST2 in (either or both of the θX and θY directions and) the Z-axis direction. Also, as shown in FIG. 3, the immersion region LR, formed at the light emitting side of the final optical element LS1 of the projection optical system PL by the immersion mechanism 1, is movable across the substrate stage ST1 and the measurement stage ST2. In moving the immersion region LR, the control apparatus CONT uses the stage drive apparatuses SD1 and SD2 to move the substrate stage ST1 and the measurement stage ST2 together within the X-Y plane with an edge of the upper surface F1 of the substrate stage ST1 and an edge of the upper surface F2 of the measurement stage ST2 being brought into contact with or close to each other. The immersion region LR can thereby be moved across the substrate stage ST1 and the measurement stage ST2 with the optical path space K1 of the projection optical system PL being filled with the liquid LQ and while suppressing outflow of the liquid LQ from a gap between the substrate stage ST1 and the measurement stage ST2. In this process, the substrate stage ST1 and the measurement stage ST2 are driven in parallel with the upper surfaces F1 and F2 thereof being set at substantially the same height (Z position).

Figure 4:
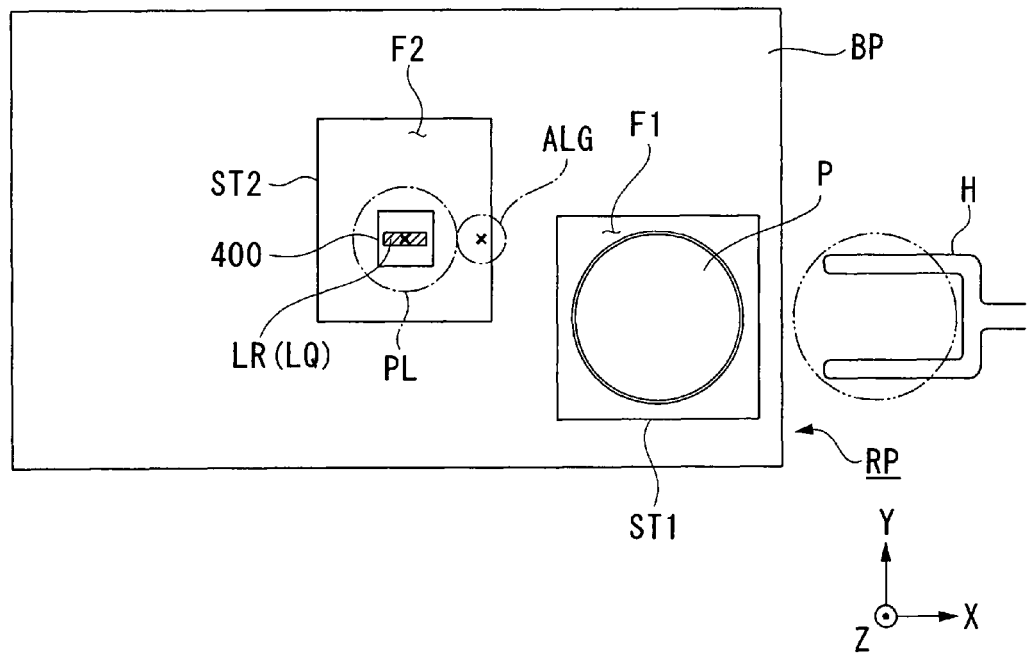
FIG. 4 is a plan view for explaining an example of operation of the exposure apparatus.
Figure 5:
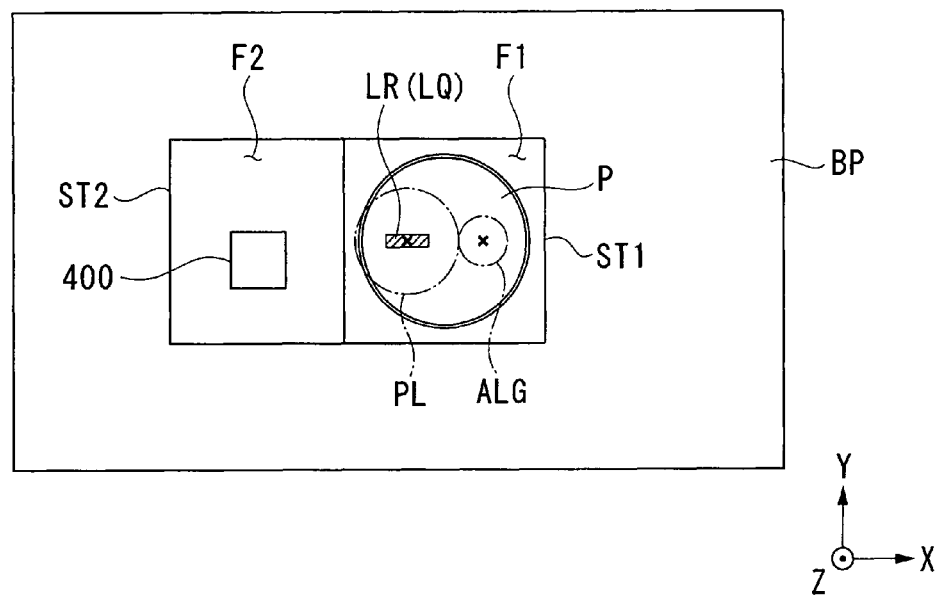
FIG. 5 is a plan view for explaining an example of operation of the exposure apparatus.
Figure 6:
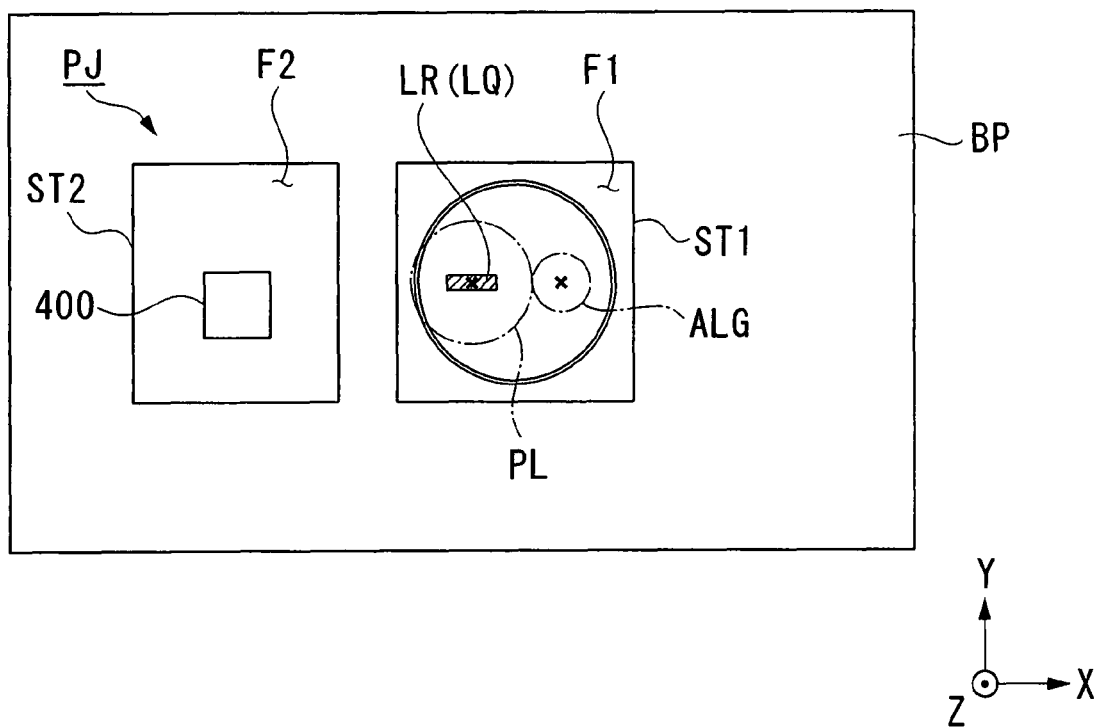
FIG. 6 is a plan view for explaining an example of operation of the exposure apparatus.
Figure 7:
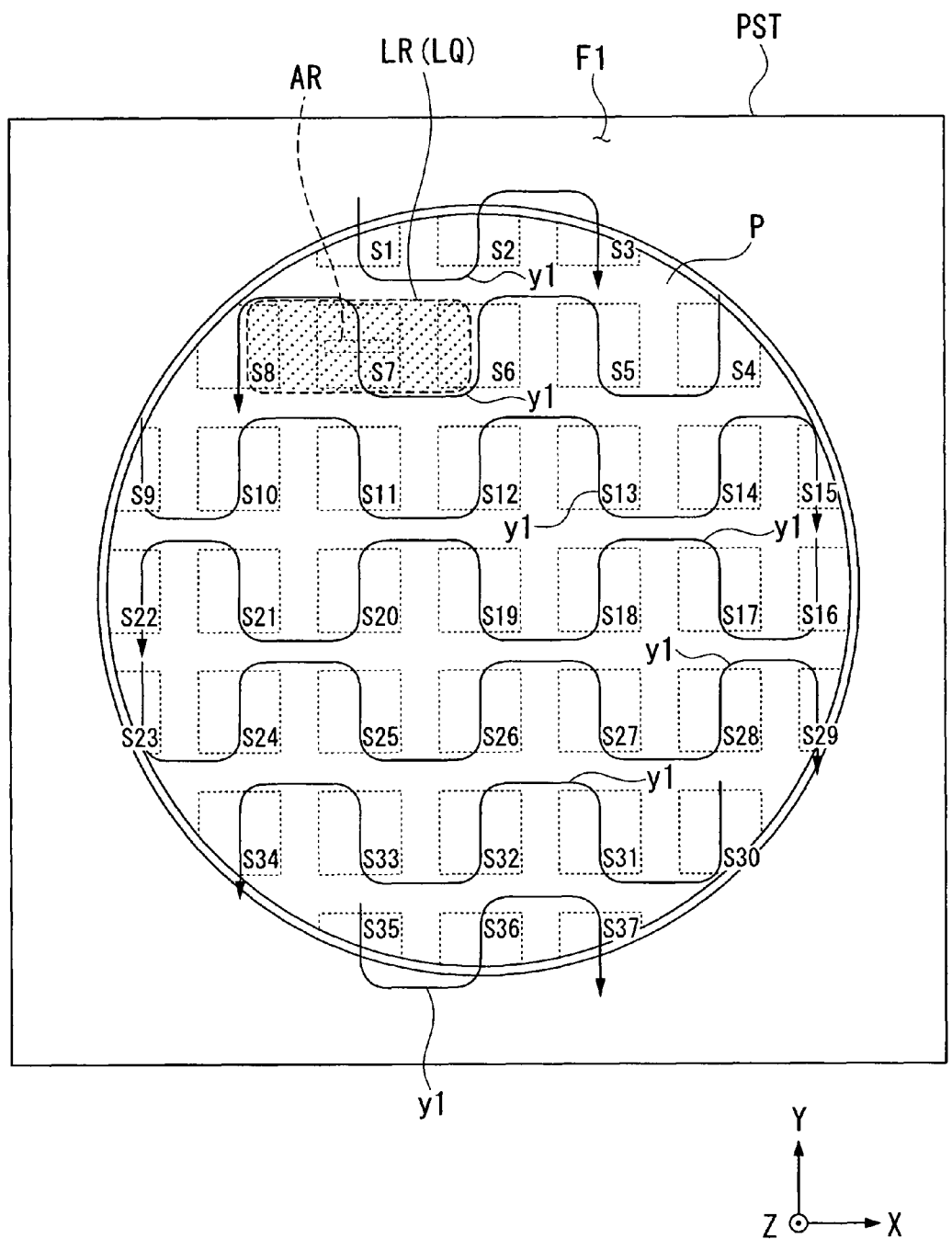
FIG. 7 is a diagram for explaining a positional relationship between a substrate and an exposure light during exposure of shot regions on the substrate.

An example of a method of exposing the substrate P using the exposure apparatus EX with the above-described arrangement shall now be described. First, an example of operations of the substrate stage ST1 and the measurement stage ST2 shall be described with reference to FIGS. 4 to 7. FIGS. 4 to 6 are views of the substrate stage ST1 and the measurement stage ST2 as viewed from above, and FIG. 7 is a view of the substrate stage ST1 as viewed from above.

In the description that follows, it shall be deemed that by the immersion mechanism 1, the operation of supplying the liquid LQ to the optical path space K1 and the operation of recovering the liquid LQ of the optical path space K1 are performed continuously in parallel so that the liquid LQ is constantly maintained in the optical path space K1 at the image plane side of the projection optical system PL.

A state, in which the immersion region LR is formed on the measurement stage ST2, and the substrate stage ST1 is positioned at a substrate exchange position RP to perform a substrate exchange operation, is shown in FIG. 4.

In FIG. 4, the control apparatus CONT uses the conveying apparatus H to unload (convey out) a substrate, which has been subject to the exposure process, from the substrate stage ST1, and load (convey in) the substrate P, to be subject to the exposure process next, onto the substrate stage ST1.

During the substrate exchange operation at the substrate stage ST1, the control apparatus CONT executes a measurement operation via the liquid LQ using the aerial image measurement sensor installed on the measurement stage ST2. As shown in FIG. 4, the control apparatus CONT forms the immersion region LR on the upper plate 400 on the measurement stage ST2. In this state, the aerial image measurement sensor receives, via a light transmitting portion formed on the upper plate 400, the exposure light EL that has passed through the liquid LQ between the projection optical system PL and the upper plate 400 and performs measurement of the image forming characteristics of the projection optical system PL. During the substrate exchange operation, other measurement operations, such as a baseline measurement, using a reference mark plate (not shown in the figures) installed on the measurement stage ST2, a transmittance measurement, using a non-uniformity sensor (not shown in the figures), may be executed. The measurement operation that is executed is not restricted to a single operation and a plurality of measurement operations may be executed.

Based on the measurement results, the control apparatus CONT executes, for example, a calibration process, etc., on the projection optical system PL, and reflects the measurement results in the actual exposure process to be executed on the substrate P subsequently.

After the loading of the substrate P onto the substrate stage ST1 is completed and the measurement operation using the measurement stage ST2 is ended, the exposure process on the substrate P is started. With the immersion region LR being formed on the measurement stage ST2, the control apparatus CONT performs an alignment process with respect to the substrate P that has been loaded onto the substrate stage ST1. Specifically, the control apparatus CONT detects an alignment mark on the exchanged substrate P by means of the alignment system ALG and determines positional coordinates (alignment coordinates) of a plurality of shot regions disposed on the substrate P.

When the alignment process is ended, the control apparatus CONT moves at least one of either the substrate stage ST1 or the measurement stage ST2 by using the stage drive apparatus SD1 or SD2 to bring the substrate stage ST1 and the measurement stage ST2 in contact with (or close to) each other as shown in FIG. 5, and while maintaining the relative positional relationship of the substrate stage ST1 and the measurement stage ST2 in the X-axis direction, uses the stage drive apparatuses SD1 and SD2 to move the substrate stage ST1 and the measurement stage ST2 together in the −X direction. By moving the substrate stage ST1 and the measurement stage ST2 together, the control apparatus CONT moves the immersion region LR from the upper surface F2 of the measurement stage ST2 to the upper surface F1 of the substrate stage ST1. Although in the middle of the movement of the immersion region LR of the liquid LQ, formed by the immersion mechanism 1, from the upper surface F2 of the measurement stage ST2 to the upper surface F1 of the substrate stage ST1, the immersion region LR is formed so as to span across the upper surface F2 of the measurement stage ST2 and the upper surface F1 of the substrate stage ST1. Because the two stages are brought into contact with (or close to) each other, the leakage of the liquid LQ from between the stages can be prevented. When the substrate stage ST1 and the measurement stage ST2 are further moved together further for a predetermined distance in the −X direction, a state, in which the liquid LQ is held between the final optical element LS1 of the projection optical system PL and the substrate stage ST1 (substrate P), is entered, and the immersion region LR of the liquid LQ, formed by the immersion mechanism 1, is thus formed on the upper surface F1 of the substrate stage ST1 that includes the top surface of the substrate P. The substrate stage ST1 and the measurement stage ST2 may be brought into contact with (or close to) each other before the end of the alignment process.

When the movement of the immersion region LR onto the substrate stage ST1 is completed, the control apparatus CONT separates the measurement stage ST2 from the substrate stage ST1, moves the measurement stage ST2 to a predetermined retreated position PJ, and starts exposure of the substrate P as shown in FIG. 6.

FIG. 7 is a schematic diagram of a positional relationship of the projection optical system PL, the immersion region LR, and the substrate P when the substrate P is moved, with the immersion region LR being formed on the top surface of the substrate P, to expose the substrate P. The plurality of shot regions S1 to S37 are set in a matrix form on the substrate P, and each of the plurality of shot regions S1 to S37 is exposed successively. The control apparatus CONT successively transfers the device pattern of the mask M onto each of the plurality of shot regions S1 to S37 on the substrate P.

As mentioned above, the exposure apparatus EX according to the present embodiment is a scan type exposure apparatus that exposes the substrate P while synchronously moving the mask M and the substrate P in the scan direction. The control apparatus CONT uses the substrate stage drive apparatus SD1 to move the substrate stage ST1 within the X-Y plane while measuring (monitoring) the position of the substrate stage ST1 by means of the laser interferometer 54, where the respective shot regions are exposed while moving the substrate P with respect to the exposure light EL. The control apparatus CONT exposes the plurality of shot regions S1 to S37 while moving the exposure light EL (optical axis AX of the projection optical system PL) and the substrate P in a relative manner, for example, as indicated by arrows y1 in FIG. 7. The immersion region LR is formed on the optical path of the exposure light EL and during the exposure of the shot regions S1 to S37 on the substrate P, the substrate P and the immersion region LR move in a relative manner. That is, the immersion region LR that is formed locally on a partial region of the substrate P moves across the substrate P in accompaniment with the movement of the substrate stage ST1 (substrate P).

After ending the immersion exposure on the substrate P held by the substrate stage ST1, the control apparatus CONT may move at least one of either the substrate stage ST1 or the measurement stage ST2 by using the stage drive apparatus SD1 or SD2 to bring the substrate stage ST1 and the measurement stage ST2 in contact with (or close to) each other. Then in a manner opposite of the process performed before, the control apparatus CONT moves the stages ST1 and ST2 together in the +X direction while maintaining the relative positional relationship of the substrate stage ST1 and the measurement stage ST2 in the X-axis direction and thereby moves the measurement stage ST2 to a position below the projection optical system PL. The immersion region LR formed by the immersion mechanism 1 is thereby moved onto the upper surface F2 of the measurement stage ST2. The control apparatus CONT moves the substrate stage ST1 to a predetermined position, such as the substrate exchange position RP, and uses the conveying device H to perform the substrate exchange work of unloading the exposed substrate P from the substrate stage ST1 that has been moved to the substrate exchange position RP and loading the substrate P to be subject to the exposure process onto the substrate stage ST1. The measurement stage ST2 and the substrate stage ST1 may be brought into contact with (or close to) each other in the middle of the exposure process.

Then after the alignment process is performed in the same manner as described above on the substrate P that has been loaded onto the substrate stage ST1, the immersion region LR is moved onto the substrate stage ST1. The control apparatus CONT repeats the operation of exposing the substrate P on the substrate stage ST1, the operation of moving the immersion region LR onto the measurement stage ST2, the operation of exchanging the substrate P, the operation of moving the immersion region LR onto the substrate stage ST1, onto which the substrate P has been loaded, etc., as described above to successively expose a plurality of substrates P.

Figure 8:
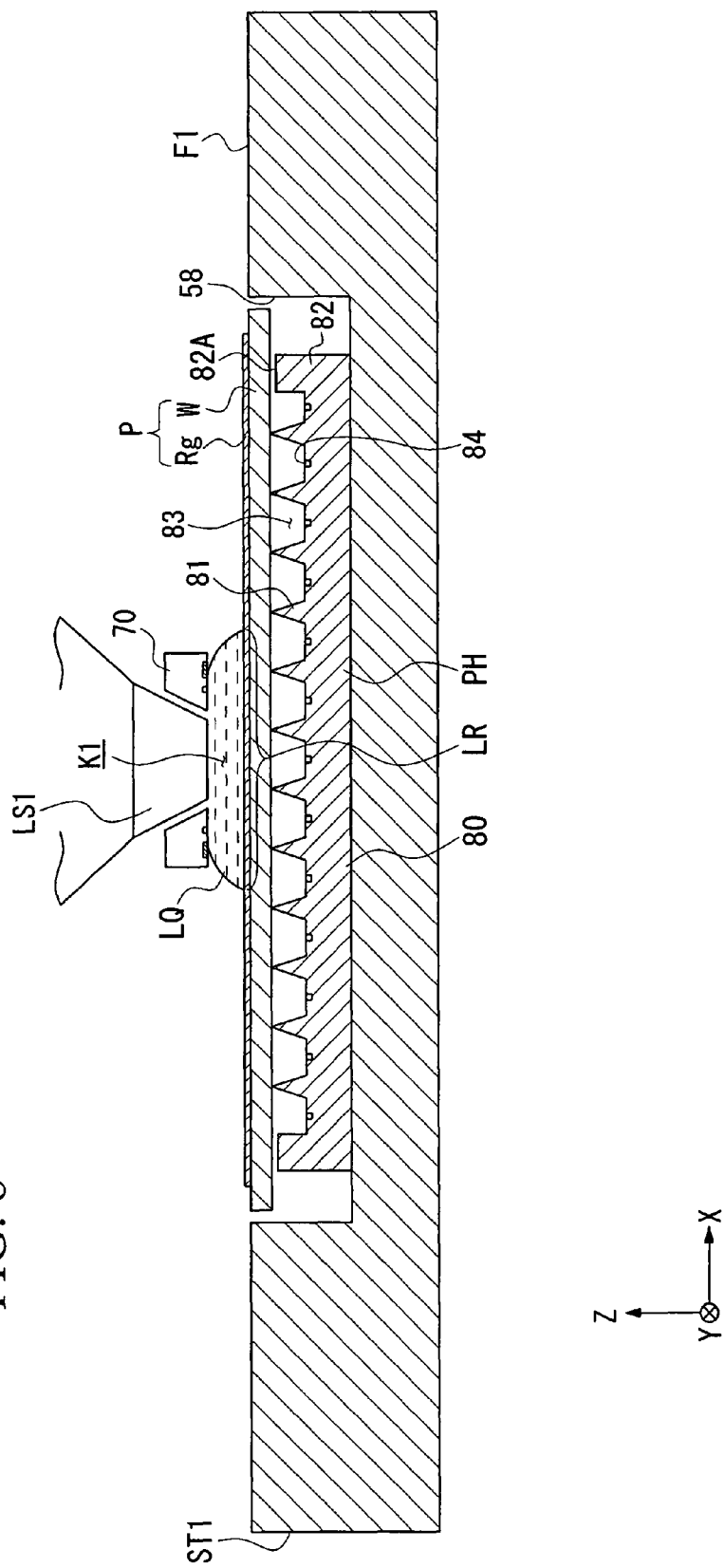
FIG. 8 is a sectional side view of a state in which the immersion region is formed on the substrate.

FIG. 8 is a diagram of a state of performing immersion exposure of the substrate P held by the substrate holder PH of the substrate stage ST1. In FIG. 8, the substrate stage ST1 has the recess portion 58, and the substrate holder PH for holding the substrate P is disposed at an inner side of the recess portion 58. The substrate holder PH includes a base member 80, supporting portions (pin portions) 81 formed on the base member 80 and that support a rear surface of the substrate P, and a peripheral wall portion (rim portion) 82 formed on the base member 80, having an upper surface that opposes the rear surface of the substrate P and being disposed so as to surround the supporting portions 81. The plurality of the supporting portions 81 of the substrate holder PH are disposed uniformly at the inner side of the peripheral wall portion 82. The supporting portions 81 include a plurality of supporting pins, and the substrate holder PH is arranged as a so-called pin chuck mechanism. The pin chuck mechanism of the substrate holder PH has a suction mechanism that includes a suction inlet 84, through which a gas in a space 83, surrounded by the base member 80 of the substrate holder PH, the peripheral wall portion 82, and the substrate P, is suctioned to put the space 83 in a negative pressure state, and holds the substrate P by suction by means of the supporting portions 81 by putting the space 83 in the negative pressure state.

The substrate P includes a base material W and a photosensitive material Rg, which is coated onto a portion of an upper surface of the base material W. Examples of the base material W include a silicon wafer. As the photosensitive material Rg, for example, a chemical amplification resist is used. Either or both of a protective coat and an antireflection coat that is referred to as a topcoat film may be provided so as to cover the photosensitive material Rg as necessary.

As shown in FIG. 8, when the substrate P is immersion exposed, the liquid LQ and the substrate P contact each other, and the liquid LQ may apply an influence on the substrate P. When the liquid LQ contacts the photosensitive material Rg, the state (physical properties, etc.) of the photosensitive material Rg may change due to the liquid LQ. For example, if the state in which the liquid LQ and the photosensitive material Rg are in contact is sustained over a long time, the liquid LQ may permeate into the photosensitive material Rg and the state of the photosensitive material Rg may thereby be changed. On the other hand, in a case where the photosensitive material Rg is a chemical amplification resist, if the state in which the liquid LQ and the photosensitive material Rg are in contact is sustained over a long time, a portion of the substances (for example, a PAG (Photo Acid Generator), etc.) contained in the chemical amplification resist may elute into the liquid LQ and the state of the photosensitive material Rg may thereby be changed. Also, even in a case where the abovementioned topcoat film is provided, if the state in which liquid LQ and the topcoat film are in contact is sustained over a long time, the state of the topcoat film may change or the liquid LQ may permeate into the topcoat film and change the state of the photosensitive material Rg below. There is also, the possibility of the state of the base material W below changing via the photosensitive material Rg (or the topcoat film).

When the state in which the liquid LQ and the substrate P are in contact is thus sustained over a long time, the state of the substrate P may change due to the liquid LQ. If the substrate P, with which the state of the photosensitive material, etc., has been changed, is exposed, the desired pattern may not be formed on the substrate P. For example, in a case where the substrate P that has been in contact with the liquid LQ for no less than a predetermined time is exposed and a development process or other predetermined process is applied to the substrate P, a defect, such as the pattern formed on the substrate P not being of the desired shape (desired size), may occur in the pattern.

The control apparatus CONT thus controls operations related to the exposure process in a manner such that integration values of contact times, during which the liquid LQ of the immersion region LR contacts the respective shot regions S1 to S37 of the substrate P onto which the pattern of the mask M is transferred, do not exceed a predetermined first tolerance value.

Here, the first tolerance value is an allowed time of contact with the liquid LQ by which the state of the substrate P can be maintained at a desired state. If an integration value of a contact time during which the liquid LQ and a shot region on the substrate P are in contact, is no more than the first tolerance value, the desired pattern can be formed on the shot region. On the other hand, if an integration value of a contact time during which the liquid LQ and a shot region on the substrate P are in contact, exceeds the first tolerance value, it may not be possible to form the desired pattern on the shot region. The first tolerance value is a value that is in accordance with conditions of the substrate P, can be determined in advance by an experiment or simulation, and is stored in the storage apparatus MRY. Here, the conditions of the substrate P include such conditions as whether or not a topcoat is formed, physical properties of the film of the photosensitive material Rg or the topcoat film that contacts the liquid LQ, the film arrangement (layer arrangement), etc.

The integration value of the contact time during which the liquid LQ and a shot region on the substrate P are in contact, not only includes the time of contact of the liquid LQ and the substrate P during illumination of the exposure light EL onto the substrate P in the state in which the immersion region LR is formed on the shot region of the substrate P but also, includes the time of contact of the liquid LQ and the shot region of the substrate P before illumination of the exposure light EL onto the substrate P and the time of contact of the liquid LQ and the shot region of the substrate P after illumination of the exposure light EL onto the substrate P.

For example, during exposure of a certain shot region, among the plurality of shot regions set on the substrate P, via the immersion region LR, the liquid LQ of the immersion region LR may be in contact with a shot region that has been immersion exposed already or a shot region to be exposed afterward in addition to the shot region being exposed.

For example, in FIG. 7, when the exposure light EL is being illuminated via the immersion region LR onto the seventh shot region S7 of the substrate P, the liquid LQ of the immersion region LR contacts the sixth shot region S6, which has been immersion exposed before the seventh shot region S7, and the eighth shot region S8, which is to be exposed after the seventh shot region S7.

Also, when the exposure light EL is being illuminated via the immersion region LR onto the seventh shot region S7 of the substrate P, not only the sixth shot region S6 and the eighth shot region S8 but either or both of the already immersion exposed shot regions S1 and S2 and the shot regions S10, S11, and S12 to be immersion exposed subsequently may also, be in contact with the liquid LQ of the liquid immersion region LR. The seventh shot region S7 may be in contact with the liquid LQ of the liquid immersion region LR not just during exposure but also, before and after exposure, such as during exposure of the shot regions S1, S2, and S6 and during exposure of the shot regions S8, S10, S11, and S12, etc.

Thus between the loading onto and the unloading from the substrate stage ST1, the respective shot regions S1 to S37 on the substrate P may be in contact with the liquid LQ not just during illumination of the exposure light EL but also, for example, during movement of the substrate P for scan-exposure before and after the illumination (including the acceleration and deceleration periods, etc.), during stepping of the substrate P, during the alignment process, etc. The integration value of the contact time during which the liquid LQ of the immersion region LR and a shot region on the substrate P are in contact, includes the sum of these respective contact times.

In the present embodiment, the control apparatus CONT adjusts the relative positional relationship of the substrate P and the immersion region LR so that the integration values of the contact times, during which the liquid LQ of the immersion region LR and the respective shot regions S1 to S37 on the substrate P are in contact, do not exceed the predetermined first tolerance value between the loading of the substrate P onto the substrate stage ST1 and the unloading of the substrate P.

Specifically, the control apparatus CONT adjusts movement conditions of the substrate P so that the integration values of the contact times, during which the liquid LQ of the immersion region LR and the respective shot regions S1 to S37 on the substrate P are in contact, do not exceed the predetermined first tolerance value. Here, the movement conditions of the substrate P include at least one condition among: a movement speed; a movement acceleration/deceleration rate; and a movement direction (movement locus) of the substrate P with respect to the exposure light EL (optical path space K1).

As described above, each of the plurality of shot regions set on the substrate P may contact the liquid LQ for just a predetermined time and a predetermined number of times, including during illumination of the exposure light EL, before illumination of the exposure light EL, and after illumination of the exposure light EL. The number of times and the time during which a single shot region contacts the liquid LQ of the immersion region LR, vary according to the arrangement (positions and sizes) of the shot regions on the substrate P, movement conditions of the substrate P with respect to the immersion region LR, and the state of the immersion region LR. Here, the state of the immersion region LR includes the size and shape of the immersion region LR. The size and shape of the immersion region LR varies according to immersion conditions during the forming of the immersion region LR by the immersion mechanism 1, the movement conditions of the substrate P, etc. The immersion conditions include such conditions as the structure of the nozzle member 70 (for example, the positions and shapes of the supply ports 12, the positions and shapes of the collection ports 22, the size and shape of the bottom surface of the nozzle member 70, etc.), the amount of liquid supplied per unit time from the supply ports 12, the amount of liquid recovered per unit time via the collection ports 22, etc.

For example, either or both of the size and shape of the immersion region LR may change according to the structure of the nozzle member 70. Either or both of the size and shape of the immersion region LR may also, change according to the amount of liquid supplied per unit time from the supply ports 12, the amount of liquid recovered per unit time via the collection ports 22, etc. Also, for example, when the movement direction of the substrate P with respect to optical path space K1 is the +Y direction, the immersion region LR may, depending on the viscosity of the liquid LQ, etc., enlarge toward the +Y side, or when the movement direction of the substrate P with respect to optical path space K1 is the −Y direction, the immersion region LR may enlarge toward the −Y side. The direction of enlargement of the immersion region LR and consequently either or both of the size and shape of the immersion region LR may thus change according to the movement direction of the substrate P. The degree of enlargement of the immersion region LR may also, vary according to either or both of the movement speed and the movement acceleration/deceleration rate of the substrate P, and either or both of the size and shape of the immersion region LR may change accordingly.

Thus with the present embodiment, before actual exposure (main exposure) of the substrate P for manufacture of a device, a test exposure is performed to determine exposure conditions (including movement conditions of the substrate P, immersion conditions, etc.) such that the integration value of the contact time during which the liquid LQ of the immersion region LR and a shot region on the substrate P are in contact, will be no more than the first tolerance value, and actual exposure of the substrate P for manufacture of the device is carried out based on the exposure conditions thus determined.

Figure 9:
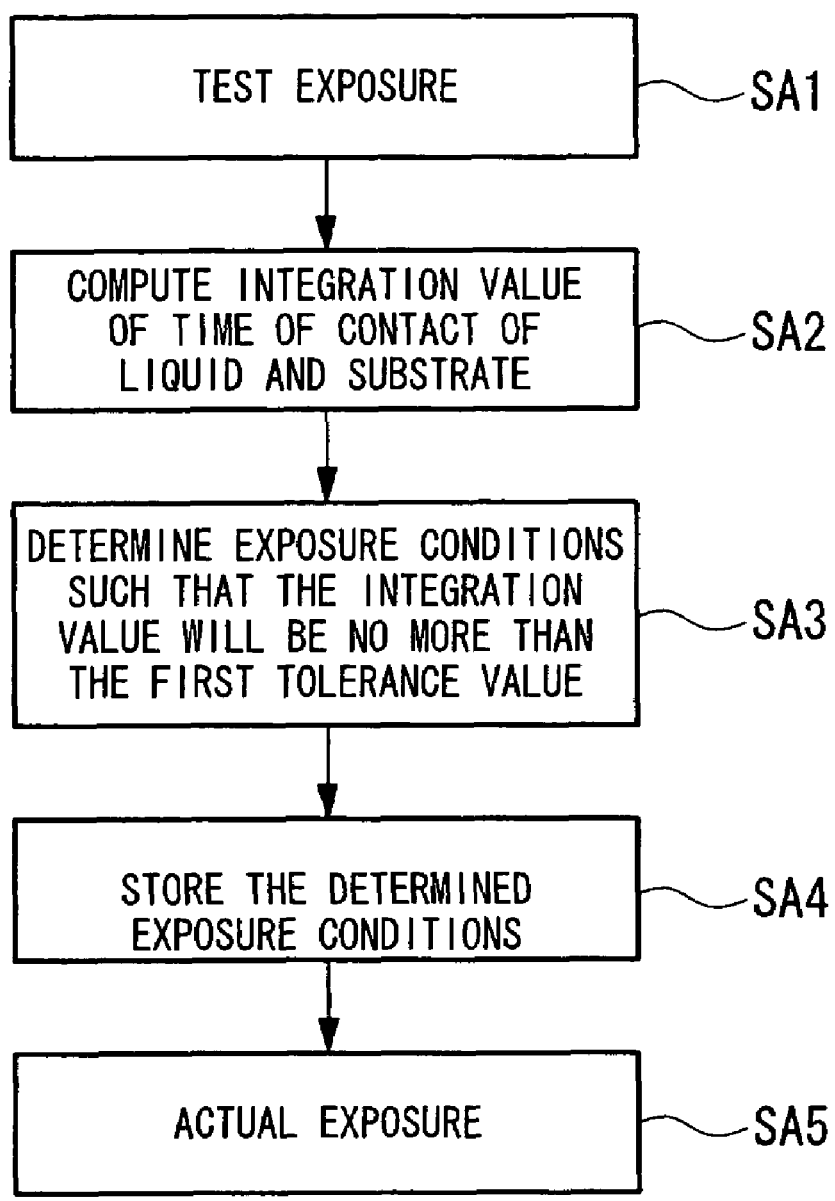
FIG. 9 is a flowchart for explaining an embodiment of an exposure method.

Specifically, as shown in the flowchart of FIG. 9, first, the control apparatus CONT loads the substrate P onto the substrate stage ST1 and performs test exposure of the substrate P with the optical path space K1 being filled with the liquid LQ and under predetermined movement conditions and immersion conditions of the substrate P (step SA1). The test exposure of the substrate P is performed for the actual arrangement (positions, sizes, and number of shot regions) of the plurality of shot regions of the substrate P. The movement conditions and immersion conditions of the substrate P during the test exposure are set to conditions, with which the integration values of the contact times of the respective shot regions with the liquid LQ are predicted not to exceed the first tolerance value, by performing simulation, etc., in advance in consideration of throughput, etc. The position information of the substrate stage ST1 (substrate P) with respect to the exposure light EL (immersion region LR) while the test exposure is being performed is measured by the laser interferometer 54, and the control apparatus CONT test-exposes the substrate P while measuring the position information of the substrate P (substrate stage ST1) by means of the laser interferometer 54.

Although during the test exposure, the remaining exposure conditions for the substrate P (for example, the exposure dose, type of the mask M (pattern), illumination conditions, etc.) besides the abovementioned movement conditions and immersion conditions do not all have to be made the same as those during the main exposure, the conditions may be matched substantially or arranged so as not to differ greatly between the test exposure and the main exposure.

Figure 10:
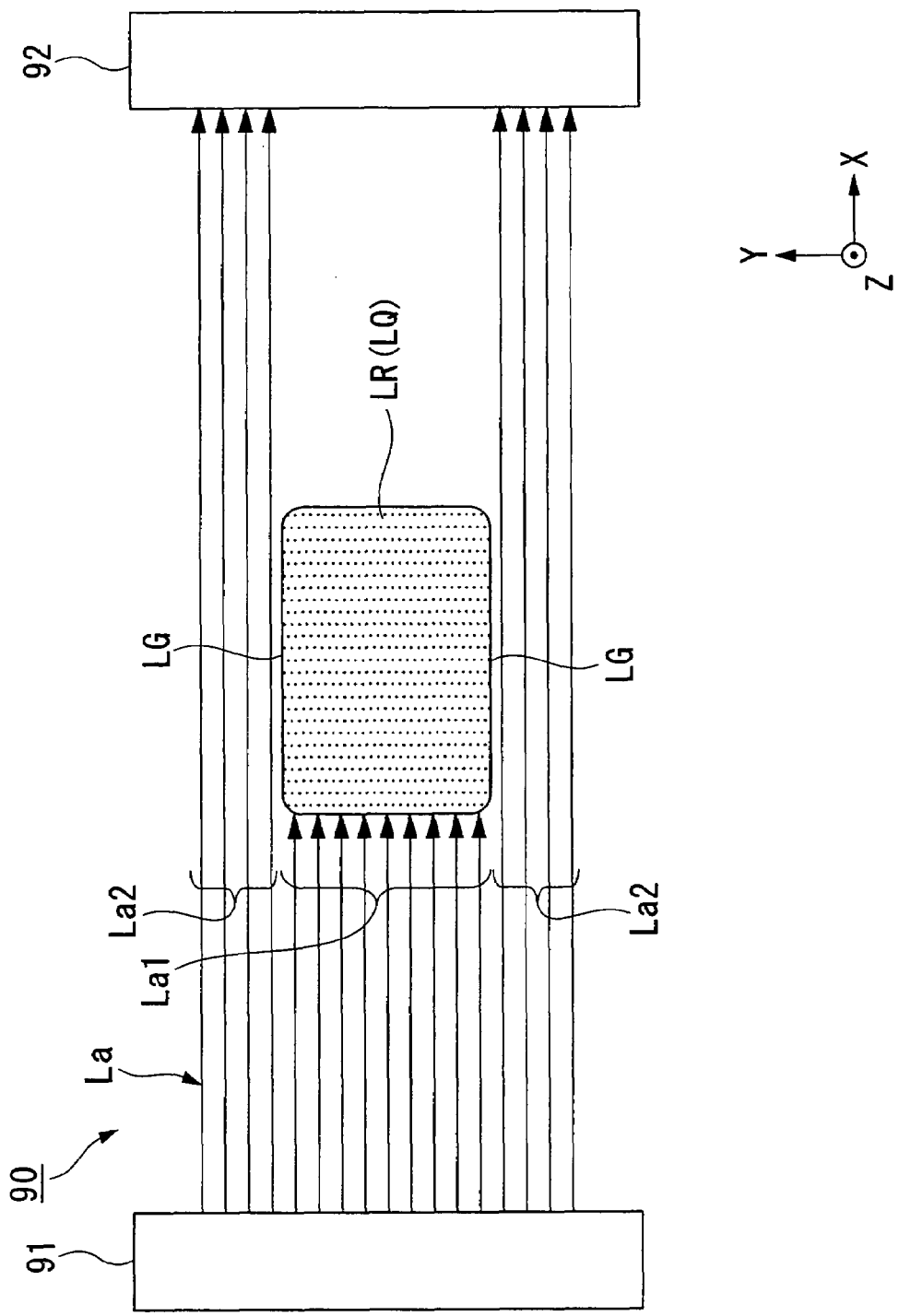
FIG. 10 is a diagram for explaining a detection apparatus that detects the state of the immersion region.

Also, the state (size and shape) of the immersion region LR during the test exposure is measured by a detection apparatus 90, such as shown in FIG. 10. In FIG. 10, the detection apparatus 90 has an emitting unit 91 that emits a detection light La and a light receiving unit 92, disposed in a predetermined positional relationship with respect to the detection light La. The detection apparatus 90 can determine the size of the immersion region LR based on results of light received by the light receiving unit 62 when the detection light La is illuminated onto each of a plurality of positions from the emitting unit 91. The emitting unit 91 illuminates the detection light La on each of the plurality of positions that include edges LG of the immersion region LR. In the example shown in FIG. 10, the emitting unit 91 illuminates a plurality of detection light components La, aligned in the Y-axis direction, along the X-axis direction.

The light receiving unit 92 has a plurality of light receiving elements corresponding to the plurality of detection light components La. The position information of these light receiving elements is known in advance from design values, etc. When detection light components La1, which are a portion of the plurality of detection light components La emitted from the emitting unit 91, are illuminated onto the liquid LQ of the immersion region LR, the detection light components La1 do not reach the light receiving elements of the light receiving unit 92 corresponding to the detection light components La1 or become decreased in the light amounts received by the light receiving elements. Meanwhile, the remaining portion La2 of the detection light components arrive at the light receiving unit 92 without passing through the liquid LQ of the immersion region LR. The detection apparatus 90 can thus determine the size of the immersion region LR based on the light receiving results of the light receiving elements of the light receiving unit 92 that received the detection light components La1 and the position information of these light receiving elements.

Also, although in the example shown in FIG. 10, the size in the Y-axis direction of the immersion region LR can be determined because the detection apparatus 90 illuminates the detection light components La onto the immersion region LR from the X-axis direction, the size in the X-axis direction of the immersion region LR can be determined by illuminating the detection light components La onto the immersion region LR from the Y-axis direction. Obviously, the detection light components La may also, be illuminated from a direction within the X-Y plane that is inclined with respect to the X-axis (Y-axis) direction. By then performing a computation process on the respective light receiving results for illumination of the detection light components La onto the immersion region LR from a plurality of directions, the detection apparatus 90 (or the control apparatus CONT) can determine the shape of the immersion region LR. The detection light components La may be illuminated parallel to the X-Y plane or in an inclined manner with respect to the X-Y plane.

As long as the state (size and shape) of the immersion region LR can be detected, the present invention is not restricted to the detection apparatus of FIG. 10, and the state of the immersion region LR may also, be detected, for example, using a detection apparatus with an image pickup element. Also, although the detection apparatus for detecting the state of the immersion region LR is of an arrangement, in which the emitting unit and the light receiving unit are disposed so as to sandwich the immersion region LR, the present invention is not limited thereto and, for example, a detection apparatus, with which a plurality of detection units are disposed on the nozzle member 70 so as to surround the immersion region LR, may be used instead.

The substrate P used in this process may be the substrate P that is used in the actual exposure or may be a test exposure substrate having a surface state (substrate conditions) equivalent to that of the substrate P used in the actual exposure.

Based on the position information on the substrate P (substrate stage ST1), which is the measurement result of the laser interferometer 54, the control apparatus CONT can determine the relative positional relationship between the liquid LQ of the immersion region LR, formed on the optical path of the exposure light EL, and the respective shot regions on the substrate P. Also, based on the position information on the substrate P (substrate stage ST1), which is the measurement result of the laser interferometer 54 and the state (size and shape) of the immersion region LR, which is the detection result of the detection apparatus 90, the control apparatus CONT can determine the number of times the respective shot regions on the substrate P contact the liquid LQ of the immersion region LR and the contact times of the respective contacts. Because the arrangement of the shot regions (shot map) set on the substrate P is known and the size and shape of the immersion region LR is detected by the detection apparatus 90, the control apparatus CONT can determine the number of times the respective shot regions contact the liquid LQ of the immersion region LR and the contact times of the respective contacts based on the measurement result of the laser interferometer 54. The control apparatus CONT can thus determine the integration values of the contact times, during which the liquid LQ of the immersion region LR and the respective shot regions on the substrate P are in contact (step SA2).

The control apparatus CONT then determines the exposure conditions (including the movement conditions and immersion conditions of the substrate P) so that the integration values of the contact times, during which the liquid LQ of the immersion region LR and the respective shot regions on the substrate P are in contact, are no more than the first tolerance value (step A3). That is, the control apparatus CONT judges whether or not any of the integration values of the contact times of the respective shot regions computed in step SA2 exceeds the first tolerance value, and if none of the integration values of the contact times of the shot regions exceeds the first tolerance value, sets the conditions during the test exposure as the actual exposure conditions for subsequent substrates P. If there is a shot region for which the integration value of the time of contact with the liquid LQ exceeds the first tolerance value, the conditions during the test exposure are corrected (adjusted) to determine actual exposure conditions such that all of the integration values of the contact times of the shot regions are no more than the first tolerance value. The control apparatus CONT stores the information related to the exposure conditions (including the movement conditions and immersion conditions of the substrate P), determined based on the test exposure, in the memory apparatus MRY (step SA4).

The control apparatus CONT then performs exposure (actual exposure) of the substrate P for manufacturing a device based on the determined exposure conditions (step SA5). Based on the exposure conditions (movement conditions), stored in the storage apparatus MRY in step SA4, the control apparatus CONT drives the substrate stage ST1 that holds the substrate P while monitoring the position information of the substrate stage ST1 by means of the laser interferometer 54 and performs immersion exposure of the substrate P while adjusting the relative positional relationship between the substrate P and the immersion region LR. The shot regions S1 to S37 can thereby be exposed without the integration value of the contact time during which the liquid LQ of the immersion region LR and a shot region on the substrate P are in contact, exceeding the first tolerance value.

Although here, the state of the immersion region LR is detected using the detection apparatus 90 and the integration values of the contact times, during which the liquid LQ of the immersion region LR and the respective shot regions on the substrate P are in contact, are determined based on the detection results and the measurement results of the laser interferometer 54, for example, a predetermined pattern may actually be exposed on the substrate P during the test exposure in step SA1 and the actual exposure conditions (including the movement conditions and immersion conditions of the substrate P), with which the pattern shape will be in the desired state, may be determined by measuring the pattern shape formed on the substrate P using a predetermined shape measurement apparatus. In this case, because it can be predicted from the test exposure that with a shot region, for which a pattern defect (including a ling width anomaly, etc.) is present on the substrate, the time of contact with the liquid LQ is longer than the first tolerance value, the actual exposure conditions are determined so that the time of contact of the liquid LQ with the shot region, with which the pattern defect is present, will be shorter than that of the exposure conditions during the test exposure. On the other hand, for example, a liquid sensor, having an outer shape substantially equivalent to the substrate P, capable of being held by the substrate stage ST1 (substrate holder PH), and capable of detecting the liquid LQ, may be made to be held by the substrate stage ST1, and the integration value of the contact time during which the liquid LQ of the immersion regions LR and a shot region on the substrate P are in contact, may be determined by forming the immersion region LR on the liquid sensor and measuring the contact time during which the liquid LQ of the immersion region LR and the liquid sensor are in contact, under the same movement conditions and immersion conditions as the test exposure. The actual exposure conditions of the substrate P may be determined, based on just experiment or simulation results, so that the time of contact of the respective shot regions on the substrate P and the liquid LQ do not exceed the first tolerance value.

Figure 11:
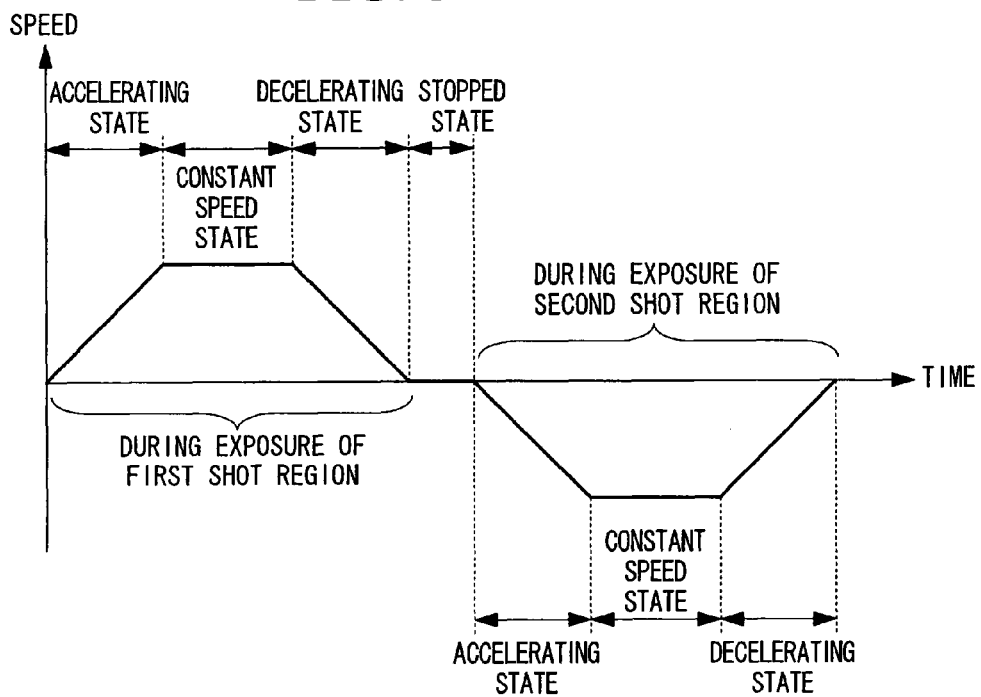
FIG. 11 is a diagram for explaining movement conditions of the substrate.

An example of the movement conditions of the substrate P is shown in FIG. 11. FIG. 11 is a diagram of a relationship of the movement speed of the substrate P in regard to the Y-axis direction and time in a case where two shot regions, aligned in the X-axis direction on the substrate P, are exposed successively. As shown in FIG. 11, when a first shot region, among the two shot regions set on the substrate P, is to be exposed, the control apparatus CONT moves the substrate stage ST1 in a manner such that, after the first shot region is moved to a scan starting position, a transition of states occurs in the order of: an accelerating state, in which the first shot region accelerates, for example, in the +Y direction with respect to the exposure light EL (projection region AR), a constant speed state, in which the first shot region moves at a constant speed, and a decelerating state, in which the first shot region decelerates. Here, for example, in the constant speed state, a pattern image of a portion of the mask M that corresponds to an illumination region of the exposure light EL on the mask M is projected onto the projection region AR of slit-like (rectangular) form of the projection optical system PL. Then for the scan-exposure of a second shot region, the control apparatus CONT, after completion of the scan-exposure of the first shot region, performs stepping operation of the substrate stage ST1 in the X-axis direction while decelerating it in regard to the Y-axis direction to move the second shot region to the scan starting position and thereafter stops the movement of the substrate P once to enter a stopped state. To expose the second shot region, the control apparatus CONT moves the substrate P in a manner such that the second shot region undergoes a transition of states in the order of: an accelerating state, a constant speed state, and a decelerating state with respect to the exposure light EL, for example, in the −Y direction.

The control apparatus CONT can adjust the movement speed of the substrate P as a movement condition of the substrate P. For example, the movement speed of the substrate P is increased so that the integration value of the contact time during which the liquid LQ of the immersion region LR and a shot region on the substrate P are in contact, does not exceed the first tolerance value. By increasing the movement speed (scan speed) during exposure while moving the shot region on the substrate P in the Y-axis direction with respect to the exposure light EL, the contact time during which the liquid LQ of the immersion region LR and the shot region on the substrate P are in contact, can be shortened and the integration value of the contact time can be decreased. To compensate for the variation of the exposure dose of the shot region that accompanies a change of the scan speed, at least one among: the intensity of the exposure light EL; the oscillation frequency; and the width of the projection region AR in the Y-axis direction; is adjusted. In illuminating the exposure light EL onto a shot region on the substrate P, the control apparatus CONT can also, adjust the integration value of the contact time during which the liquid LQ of the immersion region LR and a shot region on the substrate P are in contact, by adjusting the movement acceleration/deceleration rate of the substrate P in the Y-axis direction during the illumination of the exposure light EL.

Also, besides the movement speed and the movement acceleration/deceleration rate of the substrate P in the Y-axis direction (scan direction), the control apparatus CONT can adjust the integration value of the contact time during which the liquid LQ of the immersion region LR and a shot region on the substrate P are in contact, by adjusting either or both of the movement speed (stepping speed) and the movement acceleration/deceleration rate in the stepping operation, by which, after exposure of the first shot region among the two shot regions in FIG. 11, the next, second shot region is moved to the scan starting position for exposure of the second shot region.

The control apparatus CONT can also, adjust the integration value of the contact time during which the liquid LQ of the immersion region LR at the optical path of the exposure light EL and a shot region on the substrate P are in contact, by adjusting the movement direction (movement locus) of the substrate P with respect to the exposure light EL. The integration value of the contact time during which the liquid LQ of the immersion region LR and a shot region on the substrate P are in contact, can be adjusted, for example, by adjusting the order of exposure in successively exposing the plurality of shot regions S1 to S37 set on the substrate P or by adjusting the stepping direction, movement speed (stepping speed), or movement acceleration/deceleration rate in the stepping operation, by which, after exposure of a first shot region, a next, second shot region is moved to the scan starting position for exposure of the second shot region.

Figure 12:
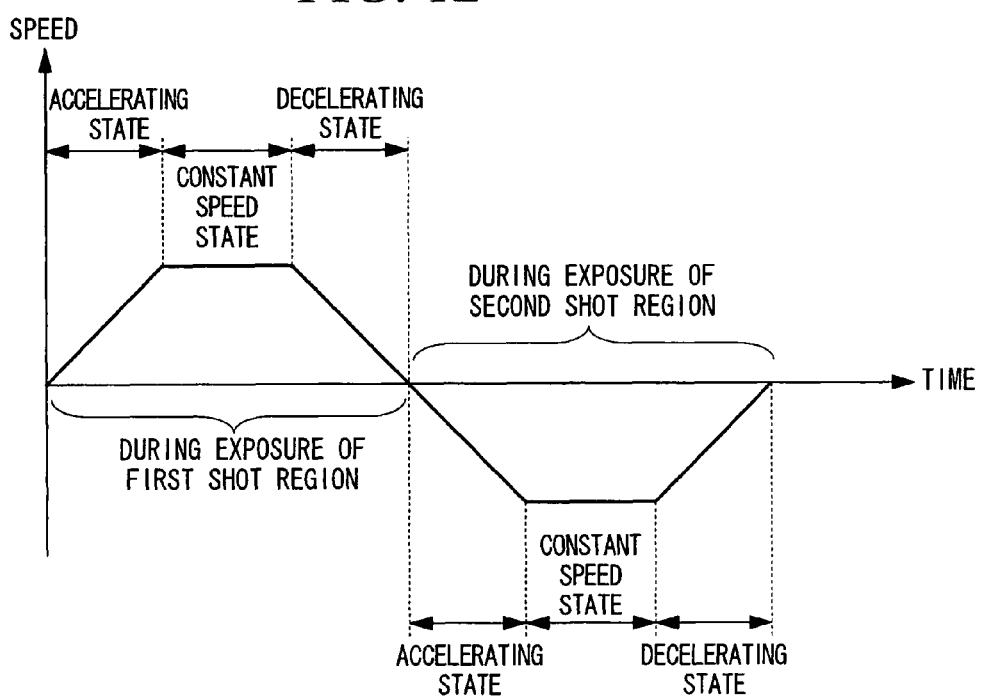
FIG. 12 is a diagram for explaining movement conditions of the substrate.

A stationary time during which the substrate P is substantially stationary with respect to the immersion region LR, is also, included among the movement conditions of the substrate P. Thus as shown in FIG. 12, the control apparatus CONT changes the stationary time during which the substrate P is substantially stationary with respect to the immersion region LR, to adjust the movement conditions of the substrate P (substrate stage ST1). The integration value of the contact time during which the liquid LQ of the immersion region LR and a shot region on the substrate P are in contact, can thereby be adjusted. With the example shown in FIG. 12, the control apparatus CONT adjusts the movement conditions of the substrate P (substrate stage ST1) so that the stationary time during which the substrate P is stationary with respect to the immersion region LR, is substantially zero.

Figure 13:
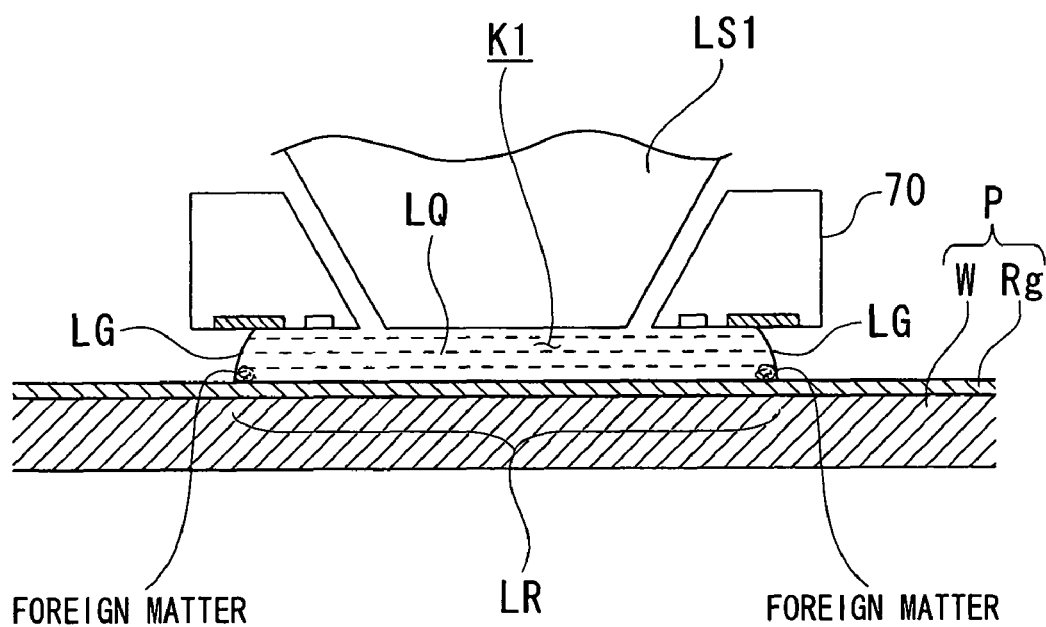
FIG. 13 is a diagram showing a manner in which foreign matter becomes attached onto the substrate at a portion corresponding to the position of an edge of the immersion region.

Regardless of the adjustment of the integration values of the times of contact of the substrate P and the liquid LQ, the stationary time during which at least a portion of the immersion region LR (an edge LG of the immersion region LR) is substantially stationary on the substrate P (that is, during which the position of the edge LG of the immersion region LR on the substrate P practically does not change), is preferably as short as possible. When a state in which an edge LG of the immersion region LR is substantially stationary on the substrate P is sustained for a long time, foreign matter (particles) may become attached to a portion of the top surface of the substrate P near the edge LG of the immersion region LR as shown in the schematic view of FIG. 13 and give rise to a defect in the pattern at the edge LG portion. In the present embodiment, a second tolerance value is set with respect to the stationary time during which an edge LG of the immersion region LR is substantially stationary on the substrate P, to suppress the influence of the liquid LQ on the substrate P. That is, the control apparatus CONT controls the operations related to the exposure process so that the stationary time during which an edge LG of the immersion region LR is substantially stationary on the substrate P, does not exceed the second tolerance value.

Here, the second tolerance value is the tolerance value of the time in which foreign matter does not become attached to a portion of the substrate P near an edge LG. If the stationary time during which an edge LG of the immersion region LR is substantially stationary on the substrate P, is no more than the second tolerance value, the state of the substrate P is maintained at a desired state and a pattern of a desired shape can be formed on the substrate P. This second tolerance value can be determined in advance by an experiment or simulation and is stored in the storage apparatus MRY.

The control apparatus CONT adjusts the relative positional relationship of the substrate P and the immersion region LR so that the stationary time during which an edge LG of the immersion region LR is substantially stationary on the substrate P, does not exceed the second tolerance value. For example, the control apparatus CONT controls the operation of the substrate stage ST1 and adjusts the movement conditions of the substrate P so that the substrate P continues to move constantly with respect to the immersion region LR.

Although the first tolerance value, concerning the integration value of the contact time during which the liquid LQ of the immersion region LR and a shot region on the substrate P are in contact, and the second tolerance value, concerning the stationary time during which an edge LG of the immersion region LR is substantially stationary on the substrate P, may be the same, these can be set to different values. For example, if the second tolerance value is smaller (more stringent) than the first tolerance value, the control apparatus CONT, for example, makes the substrate P undergo inching movement with respect to the immersion region LR, even if the time elapsed from the point at which the liquid LQ of the immersion region LR contacts the substrate P is no more than the first tolerance value, so that the stationary time during which an edge LG of the immersion region LR is substantially stationary on the substrate P, does not reach the second tolerance value. Occurrence of problems (attachment of foreign matter, etc.) due to the stationary time during which an edge LG of the immersion region LR is substantially stationary on the substrate P, exceeding the second tolerance value can thereby be prevented.

As described above, by preventing the integration value of the contact time during which the liquid LQ of the immersion region LR and a shot region on the substrate P are in contact, from exceeding the first tolerance value, the influences that the liquid LQ applies on the substrate P can be suppressed to enable a desired pattern to be formed on the substrate P.

Also, by adjusting the relative positional relationship of the substrate P and the immersion region LR so that the stationary time during which an edge LG of the immersion region LR is substantially stationary on the substrate P, does not exceed the second tolerance value, the attachment of foreign matter (particles) on the substrate P and other influences that the liquid LQ applies on the substrate P can be suppressed to enable a desired pattern to be formed on the substrate P.

In the present embodiment, the actual exposure conditions of the substrate P are determined so that the integration values of the contact times, during which the liquid LQ of the immersion region LR and the respective shot regions on the substrate P are in contact, do not exceed the first tolerance value and so that the stationary time of the immersion region LR on the substrate P does not exceed the second tolerance value, if the integration values of the times of contact of the liquid LQ of the immersion region LR with the respective shot regions on the substrate P or the stationary time of the immersion region LR on the substrate P do or do not present a problem, the actual exposure conditions may be set without considering the corresponding tolerance value.

Also, preferably in forming the immersion region LR by supplying the liquid LQ to the optical path space K1, in which the liquid LQ is not yet present, the supplying of the liquid LQ is started at a region that differs from the top surface (shot region) of the substrate P held by the substrate stage ST1, that is for example, a portion of the upper surface F1 of the substrate stage ST1 other than the top surface of the substrate P or the upper surface F2 of the measurement stage ST2. By doing so, the integration value of the contact time during which the liquid LQ of the immersion region LR and a shot region on the substrate P held by the substrate stage ST1 are in contact in the interval from the loading of the substrate P onto the substrate stage ST1 to the unloading of the substrate P, can be reduced.

Also, by starting the supplying of the liquid LQ at a region that differs from the top surface of the substrate P, even if there is foreign matter in the supply passage (internal passage) of the nozzle member 70 or the interior of the supply pipe 13, etc., the foreign matter will be supplied to the region that differs from the top surface of the substrate P. Because an immersion region LR, constituted of a clean liquid LQ, is formed on the substrate P by starting the supply of the liquid LQ at a region that differs from the top surface of the substrate P, forming the immersion region LR by performing the operation of supplying the liquid LQ to the region that differs from the top surface of the substrate P for a predetermined time, and thereafter moving the formed immersion region LR onto the substrate P, the attachment of foreign matter onto the substrate P can be prevented.

Also, in a case where the waiting time for waiting for the temperature of the nozzle member 70, etc., to stabilize is set after the start of supply of the liquid LQ to the optical path space K1, the stabilization of the temperature of the nozzle member 70, etc., is preferably not awaited with the immersion region LR being formed on the substrate P but the stabilization of the temperature of the nozzle member 70, etc., is preferably awaited, for example, with the immersion region LR being formed on the upper surface F1 of the substrate stage ST1 or the upper surface F2 of the measurement stage ST2.

If the stabilization of the temperature of the nozzle member 70, etc., is to be awaited with the immersion region LR being formed on the substrate P, the relative positional relationship of the substrate P and the immersion region LR is adjusted so that the integration value of the contact time during which the liquid LQ of the immersion region LR and a shot region on the substrate P are in contact, does not exceed the first tolerance value. In the same manner, if the stabilization of the temperature of the nozzle member 70, etc., is to be awaited with the immersion region LR being formed on the substrate P, the relative positional relationship of the substrate P and the immersion region LR is adjusted so that the stationary time during which an edge LG of the immersion region LR is substantially stationary on the substrate P, does not exceed the second tolerance value.

Although as described above, the integration value of the contact time during which the liquid LQ of the immersion region LR and a shot region on the substrate P are in contact, includes the contact time before illumination of the exposure light EL onto the substrate P and the contact time after illumination of the exposure light EL onto the substrate P, separate tolerance values (first tolerance values) may be set respectively for the integration value of the contact time before illumination of the exposure light EL onto the substrate P and the integration value of the contact time after illumination of the exposure light EL onto the substrate P. As described above, because in the case where the photosensitive material Rg is a chemical amplification resist, an acid is generated by a photo acid generator (PAG) after illumination of the exposure light EL, the state of the substrate P before illumination of the exposure light EL and the state of the substrate P after illumination of the exposure light EL may differ from each other. That is, among cases where a pattern is to be formed to a desired shape on the substrate P, there are cases where although a comparatively large integration value of the contact time is tolerated before illumination (or after illumination) of the exposure light EL onto the substrate P, the integration value of the contact time after illumination (or before illumination) of the exposure light EL onto the substrate P needs to be shortened. The first tolerance values may thus be set in consideration respectively of the integration value of the contact time before illumination of the exposure light EL onto the substrate P and the integration value of the contact time after illumination of the exposure light EL onto the substrate P. In the same manner, in regard to the stationary time during which the immersion region LR is stationary on the substrate P, a second tolerance value for a shot region before exposure and a second tolerance value for a shot region after exposure may be set separately.

Although in the above-described embodiment, the integration values of the contact times, during which the liquid LQ of the immersion region LR and the respective shot regions on the substrate P are in contact, are prevented from exceeding the predetermined first tolerance value, the object of the integration value computation is not limited thereto and, for example, an integration value of a contact time during which the liquid LQ of the immersion region LR and the substrate P as a whole are in contact may be prevented from exceeding a predetermined tolerance value.

Second Embodiment

A second embodiment shall now be described. In the following description, components that are the same as or equivalent to those of the above-described embodiment shall be provided with the same symbols and description thereof shall be simplified or omitted.

Although operations during exposure of the substrate P were described above with the first embodiment, the relative positional relationship of the substrate P and the immersion region LR can, in the same manner, be adjusted in regard to operations in performing predetermined processes related to exposure.

For example, before exposing the substrate P, an alignment process, which includes an operation of detecting an alignment mark on the substrate P using the alignment system ALG, is performed. Although in the present embodiment, the detection of the alignment mark by the alignment system ALG is performed with the immersion region LR being formed on the measurement stage ST2, depending on the positional relationship (distance) of the projection optical system PL and the alignment system ALG, the measurement stage ST2 and the substrate stage ST1 may have to be brought into contact with (or close to) each other and moved together and at least a portion of the immersion region LR may have to be formed on the substrate stage ST1 during the alignment process. In this case, the liquid LQ of the immersion region LR that is formed at the image plane side of the projection optical system PL and the substrate P may be brought into contact. The control apparatus CONT thus controls the operations of the substrate stage ST1, etc., so that the integration value of the contact time during which the liquid LQ of the immersion region LR and a shot region on the substrate P are in contact, does not exceed the first tolerance value with the inclusion of the alignment process. Specifically, the time for processing by the alignment system ALG and the movement conditions of the substrate P during the alignment process using the alignment system ALG are controlled to adjust the times of contact of the liquid LQ of the immersion region LR and the shot regions on the substrate P. The influences that the liquid LQ applies on the substrate P can thereby be suppressed.

In order to secure a degree of freedom in the actual exposure conditions of the substrate P, the time of contact of the liquid LQ of the immersion region LR and the substrate P during the alignment process is preferably set to zero as in the first embodiment or made as short as possible.

Also, because the above-described alignment process is performed in a state in which the alignment system ALG and the alignment mark on the substrate P are substantially stationary, in a case where the immersion region LR is formed on the substrate P, either or both of the time for processing by the alignment system ALG and the movement conditions of the substrate P are adjusted so that the stationary time during which an edge LG of the immersion region LR is substantially stationary on the substrate P does not exceed the second tolerance value. The influences that the liquid LQ applies on the substrate P can thereby be suppressed.

As described above, by adjusting the predetermined processing times in the series of sequences, the influences that the liquid LQ applies on the substrate P can be suppressed.

Although a description was provided here using the alignment system ALG as an example of a processing device that performs a predetermined process, the same applies not just to the alignment system ALG but also, to other processing devices that perform predetermined processes related to exposure (for example, the focus leveling detection system that can be used to measure step information of the substrate P, etc.).

Third Embodiment

Figure 14:
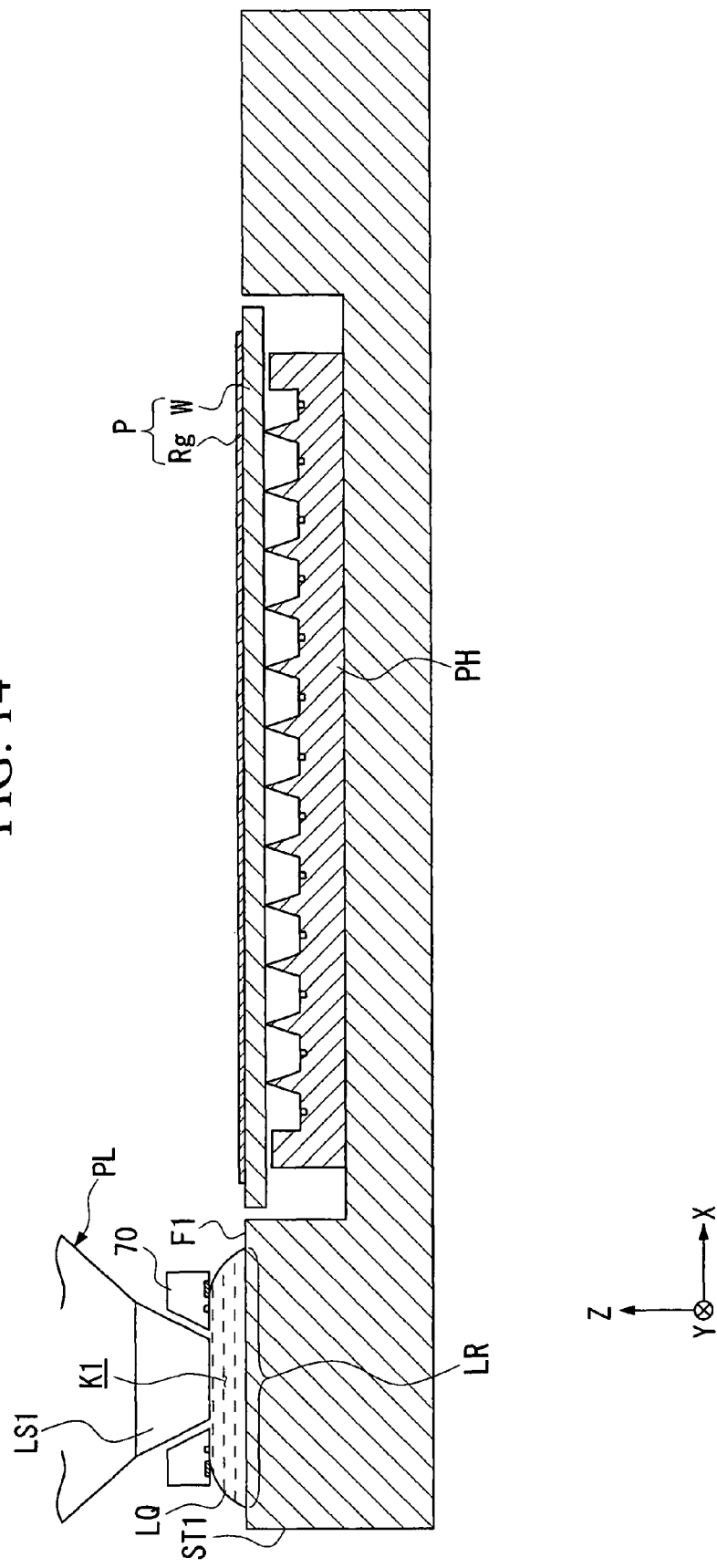
FIG. 14 is a sectional side view for explaining a state in which the immersion region has moved onto an upper surface of the substrate stage.

A third embodiment shall now be described with reference to FIG. 14. In the following description, components that are the same as or equivalent to those of the above-described embodiments shall be provided with the same symbols and description thereof shall be simplified or omitted. Although with the above-described embodiments, the control apparatus CONT adjusts the movement speed, movement acceleration/deceleration rate, movement direction (movement locus), etc., of the substrate P so that the integration value of the contact time during which the liquid LQ of the immersion region LR and a shot region on the substrate P are in contact does not exceed the first tolerance value, in the present embodiment, the control apparatus CONT moves the immersion region LR to a region that differs from a shot region (top surface) of the substrate P to prevent the integration value of the contact time during which the liquid LQ of the immersion region LR and a shot region on the substrate P are in contact from exceeding the first tolerance value. The control apparatus CONT measures the relative positional relationship of the substrate P and the immersion region LR using the laser interferometer 54 and, based on the measurement result of the laser interferometer 54, that is, the measurement result of the relative positional relationship of the substrate P and the immersion region LR, adjusts the relative positional relationship of the substrate P and the immersion region LR so that the integration value of the contact time, during which the liquid LQ of the immersion region LR and a shot region on the substrate P are in contact, does not exceed the first tolerance value.

Specifically, the control apparatus CONT controls the operation of the substrate stage ST1 while monitoring the position information of the substrate stage ST1 using the laser interferometer 54 so that the integration value of the contact time during which the liquid LQ of the immersion region LR and a shot region on the substrate P are in contact does not exceed the first tolerance value. When the integration value of the contact time during which the liquid LQ of the immersion region LR and a shot region on the substrate P are in contact is about to exceed the first tolerance value, the control apparatus CONT drives the substrate stage ST1 while using the laser interferometer 54 to monitor the position information of the substrate stage ST1 and thereby moves the immersion region LR on the substrate P to an outer side of the substrate P, that is, onto the upper surface F1 of the substrate stage ST1 as shown in FIG. 14. The integration value of the contact time during which the liquid LQ of the immersion region LR and a shot region on the substrate P are in contact can thereby be prevented from exceeding the predetermined first tolerance value.

On the other hand, the control apparatus CONT may move the immersion region LR from the substrate P onto the measurement stage ST2 to prevent the integration value of the contact time during which the liquid LQ of the immersion region LR and a shot region on the substrate P are in contact, from exceeding the first tolerance value. In the case where the immersion region LR is to be moved from above the substrate P, held by the substrate stage ST1 onto the measurement stage ST2, the substrate stage ST1 and the measurement stage ST2 can be brought into contact with (or close to) each other and the substrate stage ST1 and the measurement stage ST2 can be moved together within the X-Y plane in this state to move the immersion region LR onto the measurement stage ST2 as was described with reference to FIG. 3, etc.

The control apparatus CONT may also move the immersion region LR from the substrate P onto a predetermined object other than the substrate stage ST1 and the measurement stage ST2 so that the integration value of the contact time during which the liquid LQ of the immersion region LR and a shot region on the substrate P are in contact, does not exceed the first tolerance value.

In the same manner, the control apparatus CONT may control the operation of the substrate stage ST1 while using the laser interferometer 54 to monitor the position information of the substrate stage ST1 so that the stationary time during which an edge LG of the immersion region LR is substantially stationary on the substrate P, does not exceed the second tolerance value. When the stationary time during which the edge LG of the immersion region LR is substantially stationary on the substrate P, is about to exceed the second tolerance value, the control apparatus CONT drives the substrate stage ST1 while using the laser interferometer 54 to monitor the position information of the substrate stage ST1 to move the immersion region LR on the substrate P onto the upper surface F1 of the substrate stage ST1. The control apparatus CONT may also move the immersion region LR from the substrate P onto the measurement stage ST2 so that the stationary time during which the edge LG of the immersion region LR is substantially stationary on the substrate P, does not exceed the second tolerance value. The control apparatus CONT may also move the immersion region LR from the substrate P onto a predetermined object other than the substrate stage ST1 and the measurement stage ST2 so that the stationary time during which an edge LG of the immersion region LR is substantially stationary on the substrate P does not exceed the second tolerance value.

Fourth Embodiment

Figure 15:
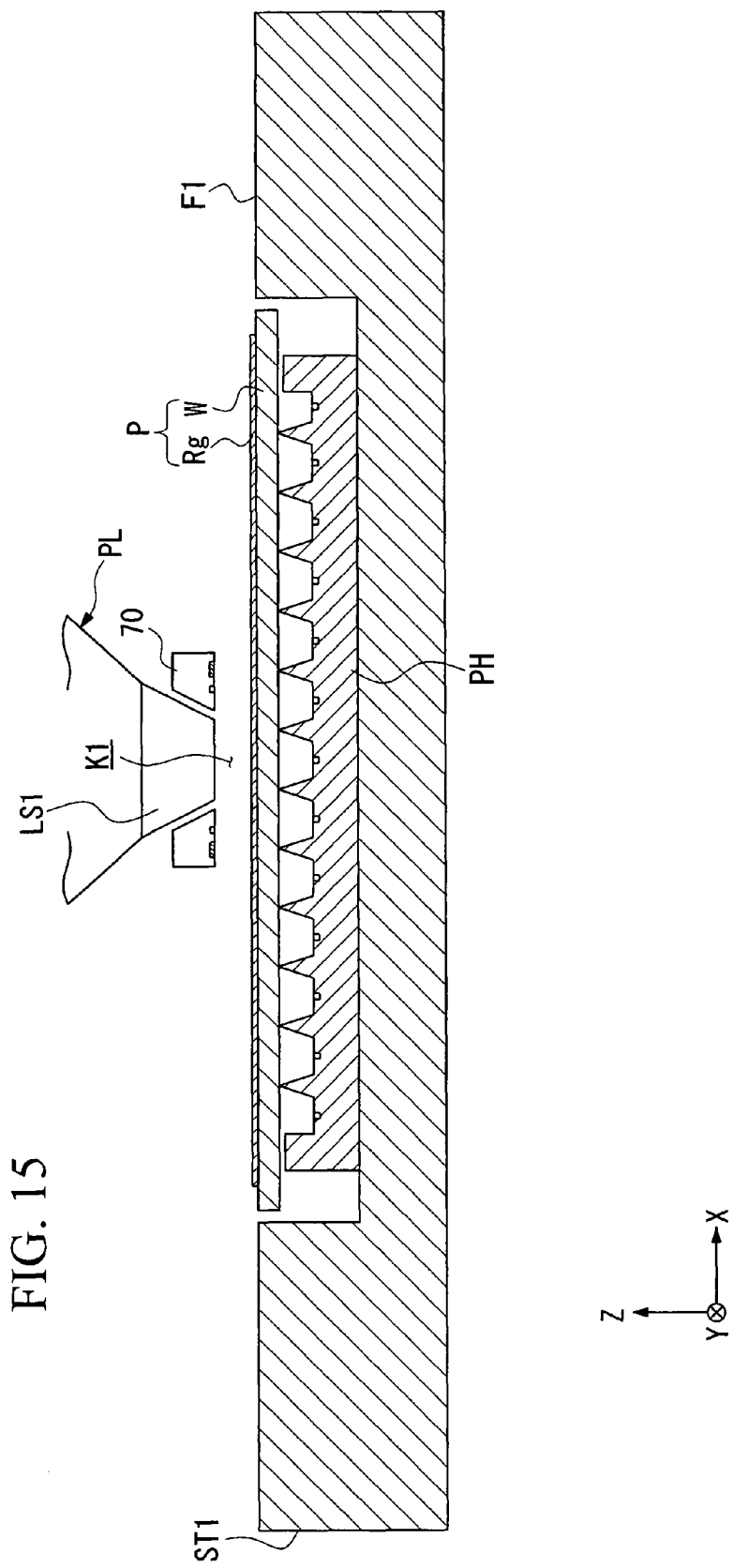
FIG. 15 is a sectional side view for explaining an example of operation of an immersion mechanism.

A fourth embodiment shall now be described with reference to FIG. 15. In the following description, components that are the same as or equivalent to those of the above-described embodiments shall be provided with the same symbols and description thereof shall be simplified or omitted. In order to prevent the integration value of the contact time during which the liquid LQ of the immersion region LR and a shot region on the substrate P are in contact, from exceeding the first tolerance value, the control apparatus CONT may stop the supply of the liquid LQ for forming the immersion region LR and remove (recover all of) the liquid LQ of the immersion region LR. In removing the liquid LQ of the immersion region LR, the control apparatus CONT controls the operation of the immersion mechanism 1. The control apparatus CONT controls the operation of the liquid supply apparatus 11 to stop the supply of the liquid LQ from the supply ports 12 to the optical path space K1, and continues the liquid recovery operation by the liquid recovery apparatus 21 via the collection ports 22 for a predetermined time after stopping the supply of the liquid LQ. The control apparatus CONT can thereby remove the liquid LQ of the immersion region LR (the liquid LQ of the optical path space K1) using the immersion mechanism 1.

The control apparatus CONT may also, remove (recover all of) the liquid LQ of the immersion region LR to prevent the stationary time during which the edge LG of the immersion region LR is substantially stationary on the substrate P, from exceeding the second tolerance value.

Although in the present embodiment, the total recovery of the liquid LQ of the immersion region LR is performed on the substrate P, the present invention is not limited thereto, and the total recovery of the liquid LQ may be performed after moving the immersion region LR onto the upper surface F1 of the substrate stage ST1 or the upper surface F2 of the measurement stage ST2, etc. Also, recovery of the liquid LQ by the liquid recovery apparatus 21 does not have to be performed necessarily and, for example, if a groove for draining liquid is provided in the substrate stage ST1 (or the measurement stage ST2) the liquid LQ of the immersion region LR may be recovered via this groove.

Fifth Embodiment

As was described with the second embodiment, there may be cases where the liquid LQ and the substrate P are brought into contact during the alignment process before exposure of the substrate P, or there may be cases where a circumstance, in which the alignment process is disabled (the alignment mark cannot be detected), occurs during the alignment process. Circumstances in which the alignment process is disabled include, for example, circumstances in which the control apparatus CONT cannot compute the position information of a shot region on the substrate P based on the output results of the alignment system ALG. In the description that follows, a state in which the alignment process is disabled shall be referred to as an "alignment error."

When an alignment error occurs, the exposure apparatus EX is operated by a manual process (assisting process) performed by an operator. For example, by an assisting process performed by the operator, a process of moving the substrate stage ST1 and thereby positioning the alignment mark on the substrate P, held by the substrate stage ST1, inside the measurement region of the alignment system ALG is performed.

Although during the assisting process by the operator, a circumstance, in which the liquid LQ of the immersion region LR, formed by the immersion mechanism 1, and a shot region on the substrate P continue to be in contact over a long time, may occur, the control apparatus CONT monitors the position information of the substrate stage ST1 by means of the laser interferometer 54 even during the assisting process by the operator. That is, the control apparatus CONT uses the laser interferometer 54 to measure the relative positional relationship of the substrate P and the immersion region LR even during the assisting process by the operator.

During the assisting process by the operator, when the integration value of the contact time during which the liquid LQ of the immersion region LR and a shot region on the substrate P are in contact, reaches a predetermined value with respect to the first tolerance value (when the integration value is about to exceed the first tolerance value), the control apparatus CONT uses the display apparatus DY to display that the integration value is about to exceed the first tolerance value.

In place of the display apparatus DY, a notification apparatus, capable of notifying various information by either or both of sound and light, may be provided and that the integration value is about to exceed the first tolerance value may be notified by means of either or both of sound and light.

That is, with the present embodiment, a time limit is set for the assisting process by the operator according to the first tolerance value, and the control apparatus CONT is arranged to use the display apparatus (notification apparatus) DY to perform display (make a notification) when the assisting process time limit is exceeded. Based on the display results on the display apparatus DY (or the notification results of the notification apparatus), the operator moves the substrate stage ST1 so that the immersion region LR and the substrate P separate and thereby moves the immersion region LR, for example, onto the upper surface F1 of the substrate stage ST1.

By thus setting an operator-assisting process time limit according to the first tolerance value and performing a display (notification) when the operator-assisting process time exceeds the assisting process time limit, the problem of the integration value of the contact time during which the liquid LQ of the immersion region LR and a shot region on the substrate P are in contact exceeding the first tolerance value can be prevented even during the operator-assisting process that is performed upon occurrence of an alignment error.

The control apparatus CONT may be arranged to perform a display (notification) after the integration value of the contact time during which the liquid LQ of the immersion region LR and a shot region on the substrate P are in contact exceeds the first tolerance value during the operator-assisting process. In this case, based on the measurement results of the laser interferometer 54, the control apparatus CONT may store information of the shot region, with which the integration value of the time of contact with the liquid LQ has exceeded the first tolerance value, in the storage apparatus MRY. Then in a subsequent process, a predetermined measure can be applied to the shot region, with which the integration value of the time of contact with the liquid LQ has exceeded the first tolerance value, based on the stored information in the storage apparatus MRY. For example, the shot region, with which the integration value of the time of contact with the liquid LQ has exceeded the first tolerance value, can be discarded, or the exposure process for exposing a pattern to be formed on an upper layer of the shot region can be omitted. Continued execution of predetermined processes on the substrate P (shot region), with which a desired pattern cannot be formed, can thereby be prevented.

Although with the fifth embodiment, a time limit, in accordance with the first tolerance value related to the integration value of the contact time during which the liquid LQ of the immersion region LR and a shot region on the substrate P are in contact is set in the operator-assisting process, a time limit, in accordance with the second tolerance value related to the stationary time during which the edge LG of the immersion region LR is substantially stationary on the substrate P, may also, be set. In this case, in order to prevent the stationary time during which an edge LG of the immersion region LR is substantially stationary on the substrate P from exceeding the second tolerance value, the control apparatus CONT can take measures such as cautioning the operator by performing a display (notification) using the display apparatus (notification apparatus) DY. Also, when the stationary time during which an edge LG of the immersion region LR is substantially stationary on the substrate P, exceeds the second stationary value, predetermined measures, such as discarding the substrate P, can be taken in subsequent processes.

Sixth Embodiment

A sixth embodiment shall now be described. In this embodiment, when, during a runup operation (including accelerated movement) for scan-exposing a certain shot region on the substrate P, an error of the position of the substrate P (including a planar position (position in the Z-axis, θX, and θY directions) of the top surface of the substrate P and the position of the substrate P in the X-Y plane) exceeds a predetermined tolerance value or a problem occurs in positional control of the substrate P, scan-exposure is not performed on the shot region and the runup operation for performing scan-exposure on the shot region is executed again. In the following description, an error state that occurs during the runup operation of the substrate P shall be referred to as a "synchronization error" where appropriate. Also, the re-performing of the runup operation for scan-exposing the shot region for which a synchronization error has occurred shall be referred to as a "retry operation" where appropriate.

When the retry operation is executed, the integration value of the time of contact with the liquid LQ becomes large not only for the shot region, with which the synchronization error has occurred, but also, for shot regions in the surroundings of that shot region.

During the exposure operation and the retry operation on each shot region on the substrate P, the position information of the substrate stage ST1 is monitored by the laser interferometer 54. After the occurrence of the synchronization error and until the retry operation is executed, the control apparatus CONT can take a measure, such as temporarily moving the immersion region LR to the upper surface F1 of the substrate stage ST1 to prevent the integration value of the contact time during which the liquid LQ of the immersion region LR and a shot region on the substrate P are in contact from exceeding the first tolerance value.

Also, the control apparatus CONT may be arranged so that when the integration value of the contact time during which the liquid LQ of the immersion region LR and a shot region on the substrate P are in contact reaches a predetermined value with respect to the first tolerance value (when the integration value is about to exceed the tolerance value), a display (notification), indicating that the integration value is about to exceed the first tolerance value, is performed using the display apparatus (notification apparatus) DY.

The control apparatus CONT can also, store information on a shot region, with which the integration value of the time of contact with the liquid LQ has exceeded the first tolerance value, in the storage apparatus MRY. In a subsequent process, a predetermined measure is applied to the shot region, with which the integration value of the time of contact with the liquid LQ has exceeded the first tolerance value, based on the stored information in the storage apparatus MRY. For example, the shot region, with which the integration value of the time of contact with the liquid LQ has exceeded the first tolerance value, is discarded, or the exposure process for exposing a pattern to be formed on an upper layer of the shot layer is omitted. Continued execution of predetermined processes on the substrate P (shot region), with which a desired pattern cannot be formed, can thereby be prevented.

With the sixth embodiment, preferably when a circumstance in which the relative position of the substrate P and the immersion region LR is substantially stationary occurs, the control apparatus CONT takes measures, such as continuing to move the substrate P on the substrate stage ST1 with respect to the immersion region LR, etc., to prevent the stationary time during which an edge LG of the immersion region LR is substantially stationary on the substrate P from exceeding the second tolerance value after the occurrence of the synchronization error and until the retry operation is executed. Also, in a case where the stationary time during which the edge LG of the immersion region LR is substantially stationary on the substrate P, exceeds the second tolerance value, a predetermined measure, such as discarding the substrate P, can be performed in a subsequent process.

As in the sixth embodiment, it is preferable to store the position of the substrate stage ST1 based on the output of the laser interferometer 54, etc., and respectively measure and store the time of contact of each shot region on the substrate P with the liquid LQ even when performing actual exposure of the substrate P. It can thereby judged, when a pattern defect, etc., occurs in a certain shot region, whether or not the pattern defect is due to the time of contact with the liquid LQ.

Seventh Embodiment

A seventh embodiment shall now be described. Although processes performed upon occurrence of an alignment error and upon occurrence of a synchronization error were described above with the fifth and sixth embodiments, various errors besides these may occur with the exposure apparatus EX. When an error occurs, the driving of the substrate stage ST1 stops, and the occurrence of an error is displayed (notified) by the display apparatus (notification apparatus) DY. Even upon occurrence of the error, the operations of supplying and recovering the liquid LQ by the immersion mechanism 1 continue. The error that occurs here is an error such that an influence is not applied to the exposure apparatus EX even if the operations of supplying and recovering the liquid LQ by the immersion mechanism 1 continue.

When an error occurs, a circumstance may arise in which operation is halted until an input operation is performed by an operator via a predetermined input apparatus (for example, a keyboard, touch panel, etc.) is awaited. For example, the operator can input an instruction concerning a restoration operation via an input device. Although there is a possibility that the liquid LQ of the immersion region LR and a shot region on the substrate P may be in contact for a long time in the interval from the occurrence of error to the performing of the input operation by the operator, the control apparatus CONT monitors the position information of the substrate stage ST1 by means of the laser interferometer 54 even when an error occurs. That is, even when an error occurs, the control apparatus CONT uses the laser interferometer 54 to measure the relative positional relationship of the substrate P and the immersion region LR.

When upon occurrence of error (in the interval from the occurrence of error to the performing of the input operation by the operator), the integration value of the contact time during which the liquid LQ of the immersion region LR and a shot region on the substrate P are in contact reaches a predetermined value with respect to the first tolerance value (when the integration value is about to exceed the first tolerance value), the control apparatus CONT can use the display apparatus (notification apparatus) DY to display (notify) that the integration value is about to exceed the first tolerance value. Also, the operator can, by an assisting process, move the substrate stage ST1 to separate the immersion region LR and the substrate P and thereby move the immersion region LR, for example, onto the upper surface F1 of the substrate stage ST1 to prevent the integration value from exceeding the first tolerance value. If possible in this case, the control apparatus CONT may move the substrate stage ST1 to separate the immersion region LR and the substrate P and move the immersion region LR, for example, onto the upper surface F1 of the substrate stage ST1.

Thus even if an error occurs with the exposure apparatus EX, the problem of the integration value of the contact time during which the liquid LQ of the immersion region LR and a shot region on the substrate P are in contact exceeding the first tolerance value can be prevented by driving the substrate stage ST1.

Also, the control apparatus CONT can store information of a shot region, with which the integration value of the time of contact with the liquid LQ has exceeded the first tolerance value, in the storage apparatus MRY. In a subsequent process, a predetermined measure is applied to the shot region, with which the integration value of the time of contact with the liquid LQ has exceeded the first tolerance value, based on the stored information in the storage apparatus MRY.

With the seventh embodiment, preferably when a circumstance in which the relative position of the substrate P and the immersion region LR is substantially stationary occurs, the control apparatus CONT takes measures, such as continuing to move the substrate P on the substrate stage ST1 with respect to the immersion region LR, etc., to prevent the stationary time during which the edge LG of the immersion region LR is substantially stationary on the substrate P from exceeding the second tolerance value, for example, in the interval from the occurrence of error to the performing of the input operation by the operator or until restoration from the error is achieved. With the above-described fifth to seventh embodiments, the notification made upon occurrence of error may be made to a host computer that manages a device manufacturing process, etc.

Although with the above-described first to seventh embodiments, the actual exposure conditions of the substrate P are determined so that the times of contact of the liquid LQ of the immersion region LR and the respective shot region on the substrate P do not exceed the first tolerance value, the times of contact of the liquid LQ and the respective shot regions are preferably made as equal as possible.

Also, with the above-described first to seventh embodiments, in a case where it can be predicted that, with a portion of the shot regions, the times of contact with the liquid LQ will exceed the first tolerance value and that patterns of abnormal size (line width) will be formed on this portion of the shot regions, the dose amount (integrated exposure amount by the exposure light EL) for this portion of the shot regions may be adjusted so that patterns of the designed size (line width) are formed.

Eighth Embodiment

Depending on the state (shape) of the immersion region LR, there is a possibility that regardless of continuously moving the substrate P with respect to the immersion region LR, the relative position of the substrate P and an edge LG of the immersion region LR practically does not change. For example, if, in a case of performing relative movement of the immersion region LR and the substrate P in a predetermined direction, the immersion region LR is of a shape in plan view that has a side (edge LG) that is substantially parallel to the predetermined direction, the edge LG of the immersion region LR may continue to be stationary on a partial region of the substrate P even when the immersion region LR and the substrate P are moved relative to each other. For example, in a case where the immersion region LR is of a rectangular shape, having a side (edge LG) that is substantially parallel to the Y-axis direction, in plan view as shown in FIG. 7, etc., if the immersion region LR and the substrate P are moved relative to each other in the Y-axis direction, the side (edge LG) of the immersion region LR parallel to the Y-axis direction continues to be practically stationary on a partial region of the substrate P even when the immersion region LR and the substrate P are moved relative to each other. In this case, the longer the length of the side (edge LG) of the immersion region LR parallel to the Y-axis direction, the longer the time during which the side (edge LG) of the immersion region LR parallel to the Y-axis direction remains stationary on the partial region of the substrate P, thus leading to the possibility of attachment of foreign matter (particles) onto the partial region of the substrate P as was described with reference to FIG. 13, etc. In the same manner, in a case where the immersion region LR and the substrate P are moved relative to each other in the X-axis direction, if the immersion region LR has a side (edge LG) that is substantially parallel to the X-axis direction, the side (edge LG) of the immersion region LR parallel to the X-axis direction may continue to be practically stationary on a partial region of the substrate P.

Thus in a case where the substrate P and the immersion region LR are moved relative to each other in a predetermined direction, by making the shape in plan view of the immersion region LR a shape without a side (edge LG) parallel to the predetermined direction or a shape, with which the length of the side (edge LG) is adequately short, a partial region of the substrate P and the edge LG of the immersion region LR can be prevented from continuing to be in contact, and the stationary time during which the edge LG of the immersion region LR is substantially stationary on the substrate P, can be suppressed from becoming long even if the substrate P and the immersion region LR are moved relative to each other in the predetermined direction. For example, by making the shape of the immersion region LR in plan view a rhomboid shape as shown in the schematic view of FIG. 16 and thereby making a side (edge LG) parallel to a direction (X-axis direction or Y-axis direction), in which the substrate P and the immersion region LR are moved relative to each other, adequately short, a partial region of the substrate P and the edge LG of the immersion region LR can be prevented from continuing to be practically in contact even if the substrate P and the immersion region LR are moved relative to each other in a predetermined direction (X-axis direction or Y-axis direction).

Figure 16:
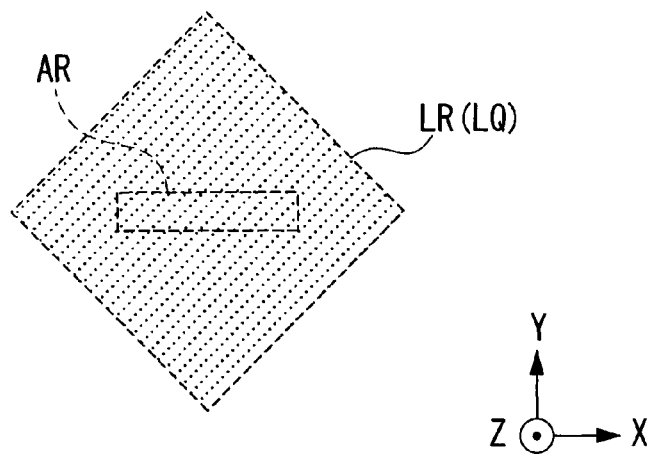
FIG. 16 is a diagram showing an example of the shape of the immersion region.

The shape of the immersion region LR described with reference to FIG. 16 is just one example, and a circular shape, polygonal shape, or other arbitrary shape may be employed as long as, in cases where the substrate P and the immersion region LR are moved relative to each other in a predetermined direction, the shape does not have a side (edge LG) parallel to the predetermined direction or the shape is such that the length of a side (edge LG) in the predetermined direction is adequately short.

Needless to say, in a case where the immersion region LR has a straight edge of a certain length, it is preferable to avoid relative movement of the immersion region LR and the substrate P in a direction parallel to the straight edge or to make such relative movement as short as possible in either or both the movement distance and the movement time.

Figure 17:
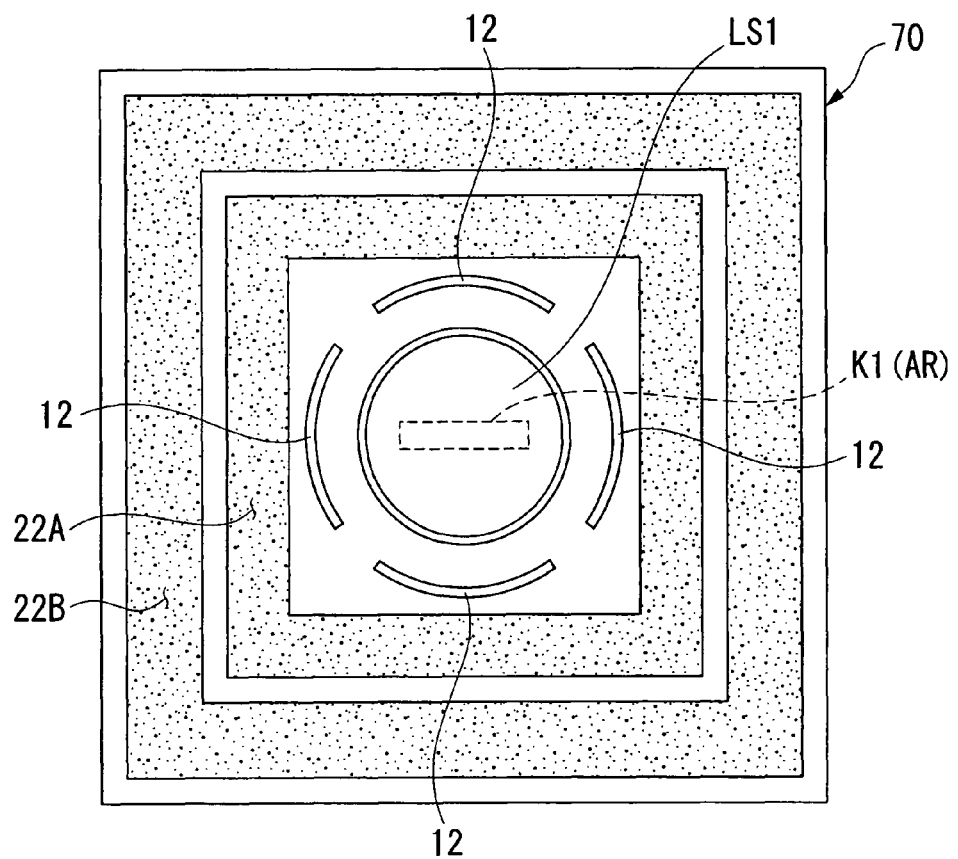
FIG. 17 is a diagram showing another embodiment of a nozzle member.

A partial region of the substrate P and an edge LR of the immersion region LR can also, be prevented from continuing to be practically in contact by optimizing the structure of the nozzle member 70 and varying the position of the edge LG of the immersion region LR. FIG. 17 is a view as viewed from below of an example of a nozzle member 70, with which the position of an edge LG of the immersion region LR can be varied. In FIG. 17, the nozzle member 70 is disposed so as to surround the final optical element LS1. At the bottom surface of the nozzle member 70, the plurality of supply ports 12 are disposed so as to surround the optical path space K1 (projection region AR). In the example shown in FIG. 17, each of the supply ports 12 has an arcuate, slit-like shape in plan view, and the arcuate, slit-like supply ports 12 are disposed so as to surround the optical path space K1. Also, on the bottom surface of the nozzle member 70, an annular first collection port 22A is disposed so as to surround the optical path space K1 and the supply ports 12. Furthermore on the bottom surface of the nozzle member 70, an annular second collection port 22B is disposed so as to surround the first collection port 22A. A porous member is disposed at each of the first collection port 22A and the second collection port 22B. A recovery passage and a recovery pipe connected to the first collection port 22A and a recovery passage and a recovery pipe connected to the second collection port 22B are independent of each other, and the immersion mechanism 1 can perform a liquid recovery operation via the first collection port 22A and a liquid recovery operation via the second collection port 22B independently of each other.

In controlling operations of the immersion mechanism 1 to perform an operation of recovering the liquid LQ via the second collection port 22B, the control apparatus CONT stops an operation of recovering the liquid LQ via the first collection port 22B to form an immersion region LR that is in accordance with the size and shape of the second collection port 22B. In this process, the control apparatus CONT controls operations of the immersion mechanism 1 to supply the liquid LQ of an amount that is in accordance with the second collection port 22B from the supply ports 12. Also, by controlling operations of the immersion mechanism 1 to perform the operation of recovering the liquid LQ via the first collection port 22A, the control apparatus CONT can form an immersion region LR that is in accordance with the size and shape of the first collection port 22A. In this process, the control apparatus CONT controls operations of the immersion mechanism 1 to supply the liquid LQ of an amount that is in accordance with the first collection port 22A from the supply ports 12.

By illuminating the exposure light EL on the substrate P while moving the substrate P with respect to the exposure light EL while switching between performing the liquid recovery operation via the first collection port 22A and performing the liquid recovery operation via the second collection port 22B, the control apparatus CONT can vary the position of the edge LG of the immersion region LR during the scan-exposure of the substrate P. By thus varying the liquid recovery position by switching between performing the liquid recovery operation via the first collection port 22A and performing the liquid recovery operation via the second collection port 22B, a partial region of the substrate P and the edge LG of the immersion region LR can be prevented from continuing to be practically in contact even when the substrate P and the immersion region LR are moved in a predetermined direction.

The nozzle member 70 described with reference to FIG. 17 is just an example, and any structure may be employed as long as it is a structure by which the position of an edge LG of the immersion region LR can be changed. For example, the nozzle member 70 may be supported by a predetermined supporting mechanism having a predetermined drive mechanism that can drive the nozzle member 70 with respect to the optical path space K1. Because the positions of the supply ports 12 (liquid supply positions) and the positions of the collection ports 22 (liquid recovery positions) with respect to the optical path space K1 can be changed by moving the nozzle member 70 itself, the position of an edge LG of the immersion region LR can be adjusted. And by performing exposure while moving the substrate P while changing the position of the nozzle member 70, a partial region of the substrate P and an edge LG of the immersion region LR can be prevented from continuing to be practically in contact.

With the above-described first to eighth embodiments, the movement path of the immersion region LR on the substrate P, that is, the movement locus of the substrate P with respect to the immersion region LR from after the loading of the substrate P onto the substrate stage ST1 to the unloading of the substrate P from the substrate stage ST1 is preferably monitored and stored. Whether or not there is a causal relationship between a pattern defect distribution on the substrate P and the movement path of the immersion region LR on the substrate P can thereby be judged.

Ninth Embodiment

Figure 18A:
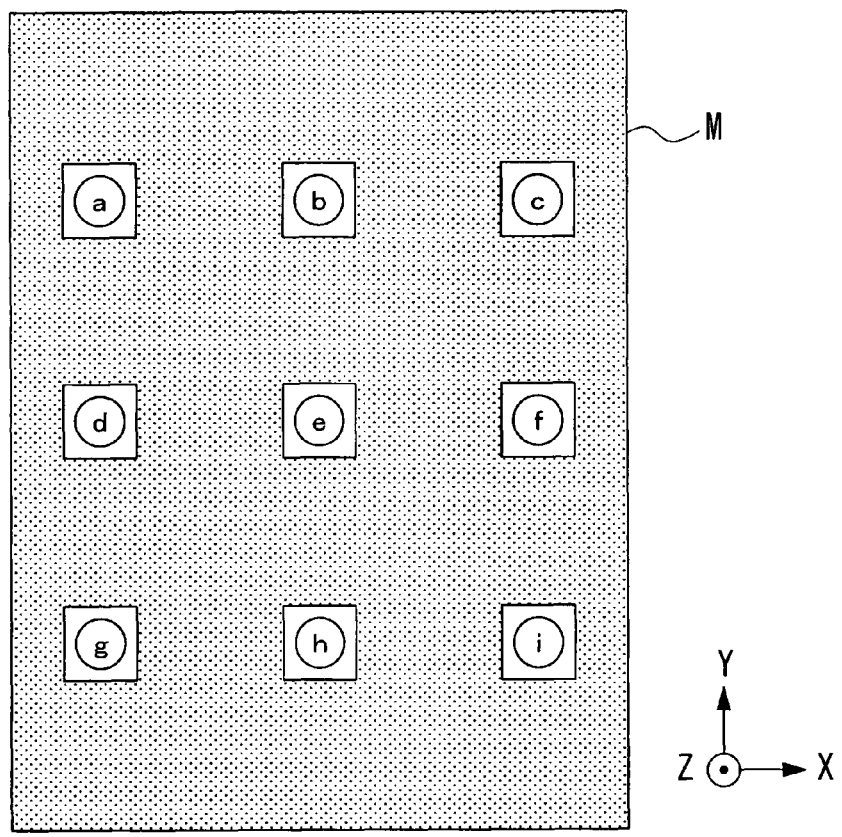
FIG. 18A is a diagram showing another embodiment of a mask.
Figure 18B:
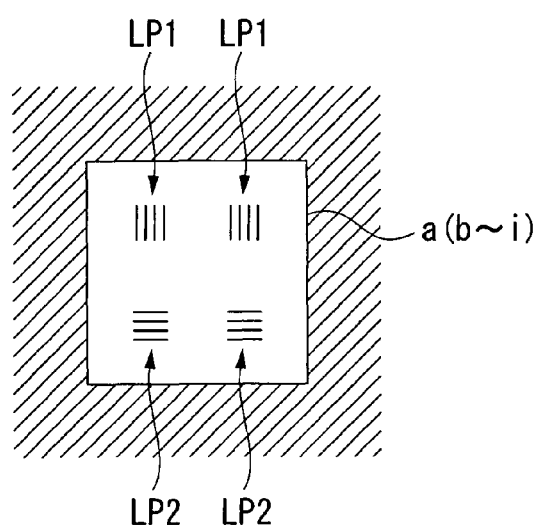
FIG. 18B is a diagram showing another embodiment of a mask.

With the present embodiment, an example of transferring a pattern onto the substrate P using a mask M having a plurality of pattern formation regions (in this case, nine), in each of which a pattern is formed as shown in FIGS. 18A and 18B, shall be described.

In FIG. 18A, the plurality of (nine) pattern formation regions "a" to "i", in each of which a pattern is formed, is set on the mask M. On the mask M, the pattern formation regions "a" to "i" are mutually spaced apart by predetermined intervals and set in a matrix-like form. Also, on the mask M, the pattern formation regions "a" to "i" are comparatively small regions and regions other than the pattern formation regions "a" to "i" are covered by a light shielding film of chromium, etc.

Each of the pattern formation regions "a" to "i" is provided with first line-and-space patterns (first L/S patterns) LP1, in each of which a plurality of line patterns, having the Y-axis direction as the longitudinal direction, are aligned at predetermined intervals in the X-axis direction, and second line-and-space patterns (second L/S patterns) LP2, in each of which a plurality of line patterns, having the X-axis direction as the longitudinal direction, are aligned at predetermined intervals in the Y-axis direction, as shown in FIG. 18B.

In transferring the first and second L/S patterns LP1 and LP2, formed in each of the pattern formation regions "a" to "i" on the mask M, onto the substrate P, the respective first and second L/S patterns LP1 and LP2 of the pattern formation regions "a" to "i" formed on the mask M are exposed onto the substrate P while synchronously moving the mask M and the substrate P in the Y-axis direction as in the respective embodiments described above.

Figure 19:
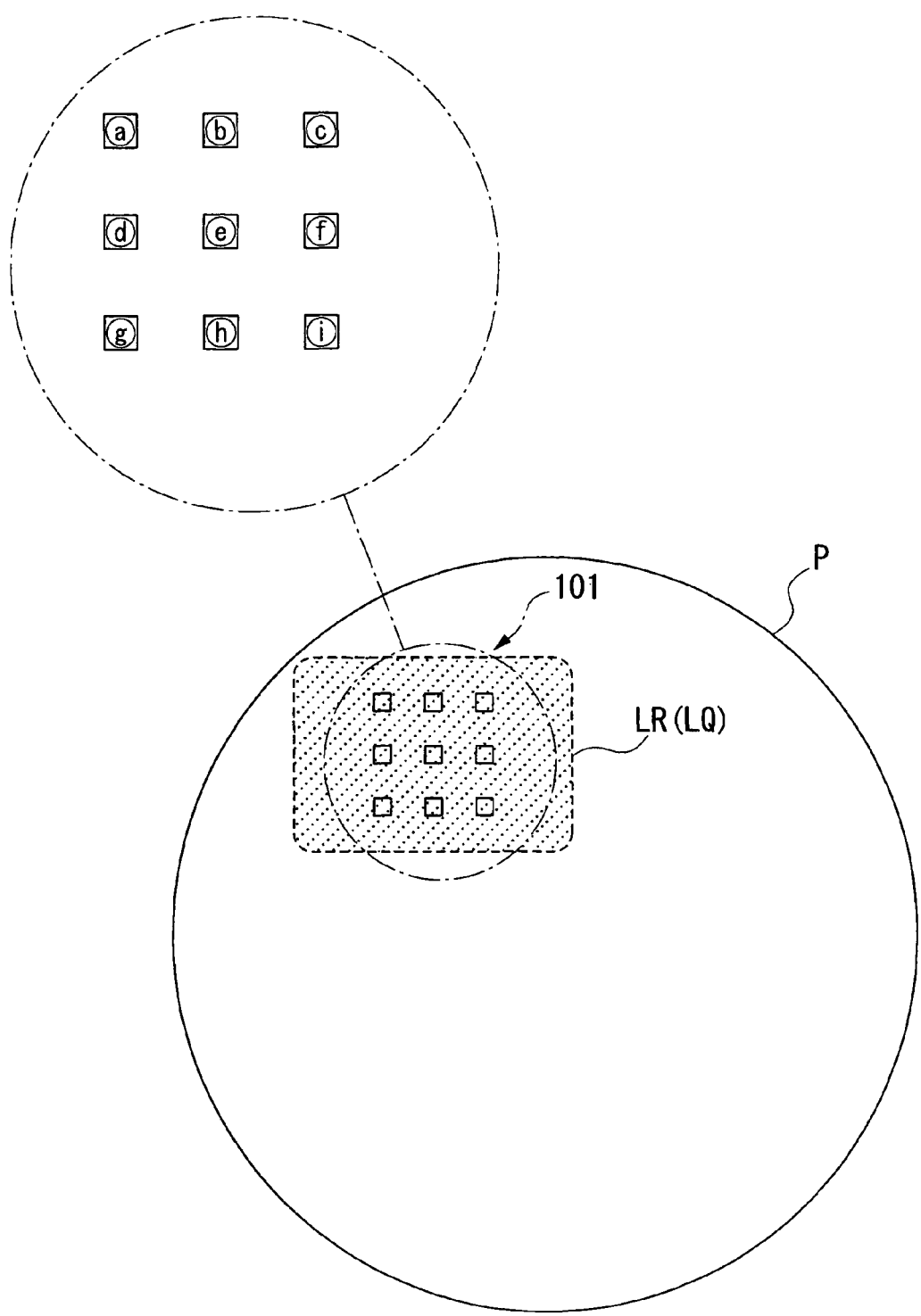
FIG. 19 is a plan view for explaining an example of an exposure operation.

FIG. 19 shows a manner in which the respective first and second L/S patterns LP1 and LP2 of the pattern formation regions "a" to "i" on the mask M are transferred onto the substrate P by a first scan-exposure. As shown in FIG. 19, by the first scan exposure, the respective first and second L/S patterns LP1 and LP2 of the pattern formation regions "a" to "i" on the mask M are transferred onto a predetermined region (first region) 101 of the substrate P.

Here, for the sake of simplicity, the respective pattern formation regions on the mask M that include the first and second L/S patterns LP1 and LP2 shall be referred to as "mask-side patterns a to i" where suitable, and the respective pattern formation regions (shot regions) on the substrate P, including the first and second L/S patterns LP1 and LP2 transferred onto the substrate P, shall be referred to as "substrate-side patterns a to i" where suitable in the description that follows.

By the mask-side patterns "a" to "i" being transferred onto the substrate P, the substrate-side patterns "a" to "i", which are mutually spaced apart by predetermined intervals and set in a matrix-like form, are formed on the substrate P. As in the above-described embodiments, the immersion region LR is formed locally on a partial region of the substrate P so as to cover the projection region AR. Also, the immersion region LR is formed so as to cover the first region 101 in which the substrate-side patterns "a" to "i" are formed.

With the present embodiment, the mask-side patterns "a" to "i" are transferred by a second scan-exposure onto positions adjacent the substrate-side patterns "a" to "i" that have been transferred onto the substrate P by the first scan-exposure. The mask-side patterns "a" to "i" are then transferred by a third scan-exposure onto positions adjacent the substrate-side patterns "a" to "i" that have been transferred onto the substrate P by the second scan-exposure. The operation of transferring the mask-side patterns "a" to "i" by a subsequent scan exposure onto positions adjacent the substrate-side patterns "a" to "i" that have been transferred onto the substrate P by a scan-exposure performed before are then repeated to form a plurality of the substrate-side patterns "a" to "i" on the substrate P. With the present embodiment, the scan exposure is repeated nine times. Nine of each of the substrate-side patterns "a" to "i" are thus formed on the substrate P.

Also, in each of the plurality of scan-exposures, the control apparatus CONT transfers the mask-side patterns "a" to "i" onto the substrate P while changing the exposure conditions. Specifically, the control apparatus CONT transfers the mask-side patterns "a" to "i" onto the substrate P while changing, for example, either or both the image plane position resulting from the projection optical system PL and the liquid LQ (the positional relationship in the Z-axis direction of the image plane of the projection optical system PL and the top surface of the substrate P) and the illumination amount (exposure dose) of the exposure light EL, etc. The shapes (including sizes, such as the ling widths, etc.) of the substrate-side patterns "a" to "i" formed on the substrate P are then evaluated, and optimal exposure conditions are derived based on the evaluation results. That is, with the present embodiment, a test exposure for determining the exposure conditions is performed using the mask M with the mask-side patterns "a" to "i".

Figure 20:
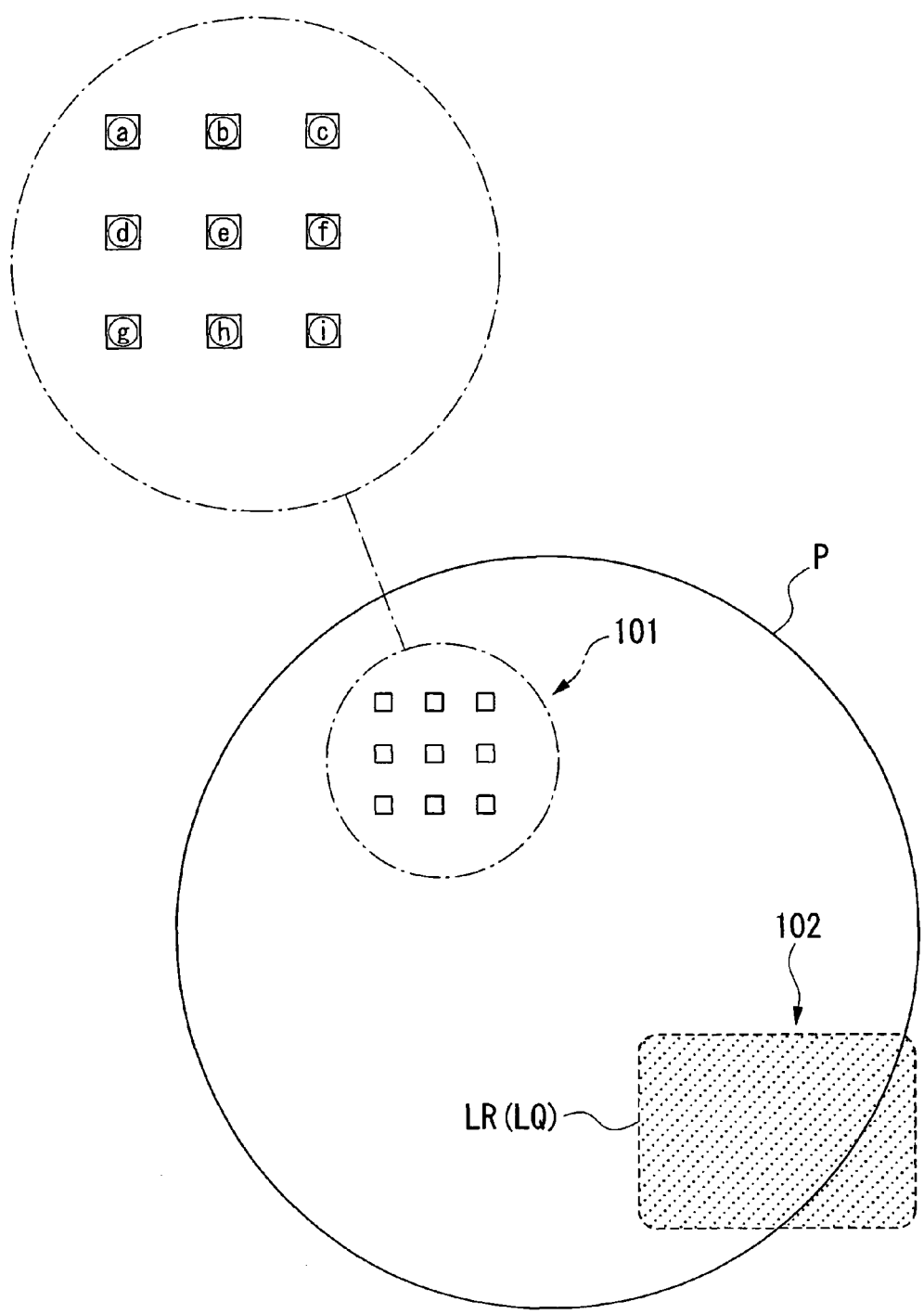
FIG. 20 is a plan view for explaining an example of an exposure operation.

FIG. 20 is a diagram showing a positional relationship of the substrate P and the immersion region LR after the first scan-exposure has ended and before the second scan-exposure has started. After the first scan-exposure has ended, the control apparatus CONT returns the mask stage MST, which holds the mask M, to the scan starting position for the second scan-exposure. While moving the mask stage MST to return the mask stage MST to the scan starting position or before or after this movement of the mask stage MST, the control apparatus CONT drives the substrate stage ST1 and moves the immersion region LR to the position shown in FIG. 20 with respect to the substrate P. That is, the control apparatus CONT moves the immersion region LR from the first region 101 of the substrate P that was in contact with the liquid LQ of the immersion region LR during the first scan-exposure to a second region 102 on the substrate P other than the first region 101. After moving the immersion region LR to the second region 102, the control apparatus CONT maintains this state for a predetermined time.

Figure 21:
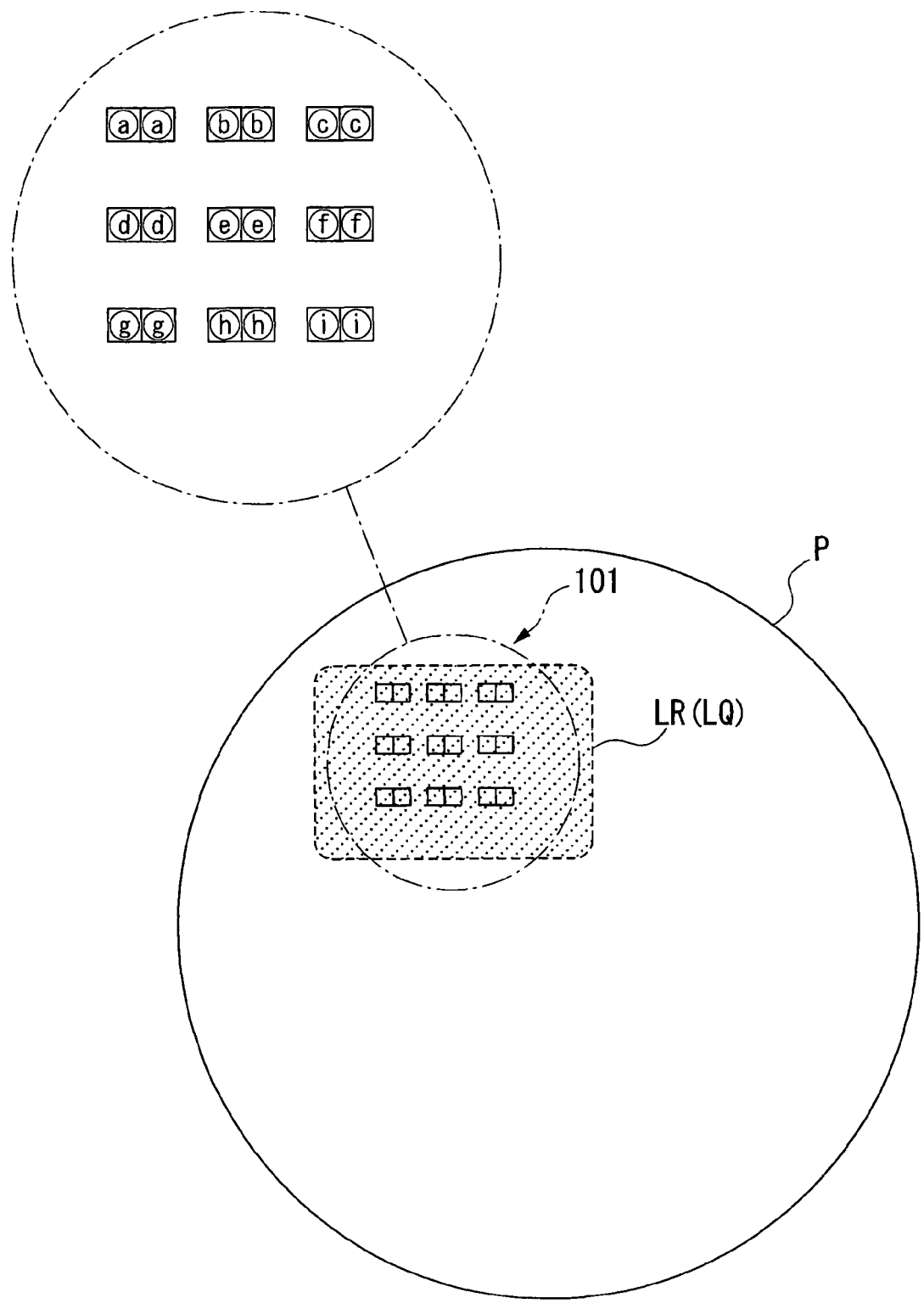
FIG. 21 is a plan view for explaining an example of an exposure operation.
Figure 22:
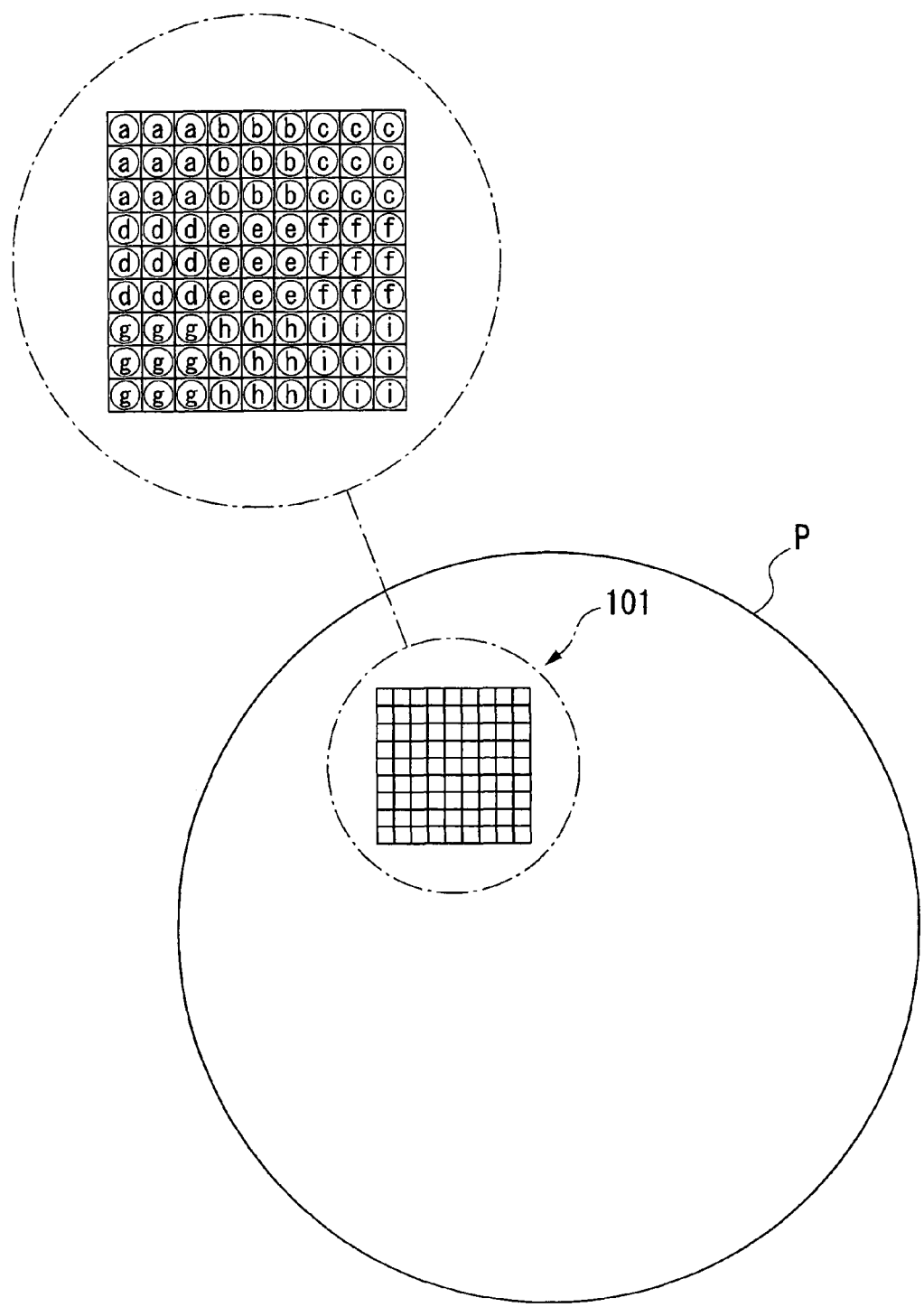
FIG. 22 is a plan view for explaining an example of an exposure operation.

After the predetermined time has elapsed, the control apparatus CONT drives the substrate stage ST1 and moves the immersion region LR to the first region 101 to perform the second scan-exposure. FIG. 21 is a diagram showing the manner in which the next mask-side patterns "a" to "i" are transferred, by the second scan -exposure, onto positions adjacent the substrate-patterns "a" to "i" that were transferred onto the substrate P before. The control apparatus CONT transfers the patterns of the mask M onto the first region 101 of the substrate P while synchronously moving the mask M and the substrate P in the Y-axis direction in the same manner as when performing the first scan-exposure.

When the second scan-exposure has ended, the control apparatus CONT drives the substrate stage ST1 to move the immersion region LR to the second region 102 and maintains this state for the predetermined time. After the predetermined time has elapsed, the control apparatus CONT drives the substrate stage ST1 and moves the immersion region LR to the first region 101 to perform the third scan-exposure. The control apparatus CONT transfers the patterns of the mask M onto the first region 101 of the substrate P while synchronously moving the mask M and the substrate P in the Y-axis direction in the same manner as when performing the first scan-exposure and the second scan-exposure.

By repeating the above operations a predetermined number of times (nine times in the present example), that is, by repeating the operation of transferring the mask-side patterns "a" to "i" by a subsequent scan-exposure onto positions adjacent the substrate-side pattern "a" to "i" that have been transferred before onto the substrate P, the plurality of substrate-side patterns "a" to "i" are transferred onto the substrate P.

By thus transferring the mask-side patterns "a" to "i" a plurality of times onto the comparatively small first region 101 on the substrate P while changing the exposure conditions, the shapes of the patterns formed by the test exposure can be evaluated in a state in which influences of the flatness of the substrate P are suppressed.

As described above, with the present embodiment, after a prior scan-exposure has ended and before a subsequent scan-exposure has started, the immersion region LR is moved once from the first region 101 of the substrate P, onto which patterns are transferred by illumination of the exposure light EL, to the second region 102 other than the first region 101. Then after the immersion region LR has been moved to the second region 102 and the predetermined time has elapsed, the immersion region LR is moved to the first region 101 for the next scan exposure.

If, for example, the second scan-exposure is performed immediately after the first scan-exposure has ended, because the subsequent illumination operation of the exposure light EL is performed before the first region 101, which has been heated by the illumination heat of the exposure light EL, is cooled, the pattern transfer precision may be degraded. Thus preferably, a waiting time, for compensating for the temperature rise of the substrate P, is set after the first scan-exposure has ended and before the second scan exposure has started. However, in an arrangement with which the cooling of the first region 101 is awaited with the immersion region LR being formed on the first region 101, the integration value of the contact time during which the liquid LQ of the immersion region LR and the first region 101 on the substrate P are in contact, becomes large. Also, because the mask-side patterns "a" to "i" are transferred a plurality of times onto the comparatively small first region 101 of the substrate P, if the immersion region LR is not moved to the second region 102 after exposure of the first region 101, only a slight movement (stepping movement) of the substrate P will suffice. The integration value of the contact time during which the liquid LQ of the immersion region LR and the first region 101 on the substrate P are in contact, thus becomes large and a state, in which an edge LG of the immersion region LR is substantially stationary on the substrate P, is entered.

Thus by moving the immersion region LR to the second region after exposure of the first region 101 and maintaining this state for the predetermined time, the integration value of the contact time during which the liquid LQ of the immersion region LR and the first region 101 on the substrate P are in contact, can be reduced and exposure of the next mask-side patterns "a" to "i" onto the first region 101 can be performed in a state in which the influences of the illumination heat of the exposure light EL due to the prior scan-exposure are reduced.

Although with the present embodiment, the immersion region LR is moved to the second region 102 other than the first region 101 on the substrate P after exposure of the first region 101 on the substrate P, the mask-side patterns "a" to "i" may be transferred onto the second region 102 when the immersion region LR has been moved to the second region 102.

Also, after exposing the first region 101 on the substrate P, the immersion region LR may be moved onto the upper surface F1 of the substrate stage ST1 or the upper surface F2 of the measurement stage ST2 without moving it to the second region 102 other than the first region 101 on the substrate P.

As described above, with the respective embodiments, pure water is used as the liquid LQ. Pure water provides the merits that large amounts can be procured readily in a semiconductor manufacturing plant, etc., and adverse effects are not applied to the photoresist on the substrate P as well as on the optical elements (lens), etc. Also, because pure water does not apply adverse effects on the environment and is extremely low in impurity content, actions of washing the top surface of the substrate P and the surface of the optical element disposed at the front end surface of the projection optical system PL can also, be anticipated. If the purity of the pure water supplied from the plant, etc., is low, the exposure apparatus may be provided with an ultrapure water production system.

The refractive index n of pure water (n) with respect to the exposure light of a wavelength of approximately 193 nm is the to be approximately 1.44, and when an ArF excimer laser light (wavelength: 193 nm) is used as the light source of the exposure light EL, the wavelength is shortened by 1/n, that is, to approximately 134 nm on the substrate P and thus a high resolution can be obtained. Furthermore, because the depth of focus is magnified by approximately n times, that is, by approximately 1.44 times, if it is sufficient to secure a depth of focus of the same level as that in use in air, the aperture number of the projection optical system PL can be increased further and the resolution can be improved from this aspect as well.

In each of the above-described embodiments, the optical element LS1 is mounted to the front end of the projection optical system PL, and this optical element LS1 can be used to adjust the optical characteristics, for example, the aberration (spherical aberration, coma aberration, etc.), of the projection optical system PL. An optical plate, used for adjustment of the optical characteristics of the projection optical system PL, may also, be used as the optical element mounted to the front end of the projection optical system PL. Also, the optical element mounted to the front end may be a plane-parallel plate (cover plate or the like) that can transmit the exposure light EL.

In the case where the pressure that arises between the substrate P and the optical element at the front end of the projection optical system PL due to the flow of the liquid LQ is large, instead of making the optical element replaceable, the optical element may be fixed securely so as not to be moved by the pressure.

In regard to the structure of the immersion mechanism 1 including the nozzle member 70, the present invention is not restricted to the above-described structures, and for example, structures described in European Patent Publication No. 1420298, PCT International Patent Publication No. 2004/055803, PCT International Patent Publication No. 2004/057590, and PCT International Patent Publication No. 2005/029559 may be employed as well.

Although in the above-described embodiments, the liquid LQ is filled between the projection optical system PL and the top surface of the substrate P, for example, a cover glass, constituted of a plane-parallel plate, may be mounted onto the top surface of the substrate P and the liquid LQ may instead be filled at least between the top surface of the cover glass and the projection optical system PL.

Also, although with the projection optical system of each of the above-described embodiments, the optical path space at the image plane side of the optical element (LS1) at the front end is filled with the liquid, a projection optical system, with which an optical path space at an object surface side of the optical element at the front end is also, filled the liquid, may be employed as well, as disclosed in PCT International Publication No. WO 2004/019128.

Although the liquid LQ of the above-described embodiments is water (pure water), the liquid LQ may be a liquid other than water. For example, if the light source of the exposure light EL is an $F_2$ laser, because this $F_2$ laser light is not transmitted through water, the liquid LQ may, for example, be a fluorocarbon fluid such as a perfluoropolyether (PFPE) or a fluorocarbon oil that can transmit the $F_2$ laser light. In this case, portions that contact the liquid LQ are lyophilized by forming a thin film, for example, from a substance with a small, polar molecular structure that contains fluorine. Liquids (for example, cedar oil) other than the above that transmit the exposure light EL, have a refractive index as high as possible, and are stable with respect to the projection optical system PL and the photoresist coated on the top surface of the substrate P may be used as the liquid LQ.

Also, as the liquid LQ, that with a refractive index of approximately 1.6 to 1.8 may be used. Furthermore, the optical element LS1 may be formed of quartz or other material with a refractive index higher than that of fluorite (for example, a refractive index no less than 1.6). As the liquid LQ, any of various liquids, such as a supercritical fluid, may be used.

Although in the respective embodiments described above, the respective position information of the mask stage MST, substrate stage ST1, and measurement stage ST2 are measured using an interferometry system (52, 54, 56), the present invention is not limited thereto and, for example, an encoder system that detects scales (diffraction gratings) disposed on the respective stages may be used instead. In this case, preferably a hybrid system, having both an interferometry system and an encoder system, is arranged and the measurement results of the encoder system are calibrated using the measurement results of the interferometry system. Also, positional control of the stages may be performed using the interferometry system and the encoder system switchingly or using both systems at the same time.

As the substrate P of each of the above-described embodiments, not only a semiconductor wafer for manufacturing a semiconductor device, but also, a glass substrate for a display device, a ceramic wafer for a thin film magnetic head, or a master mask or reticle (synthetic quartz or silicon wafer) used in the exposure apparatus, etc., can be used.

In regard to the exposure apparatus EX, besides a scan type exposure apparatus (scanning stepper), with which the pattern of the mask M is scan-exposed while synchronously moving the mask M and the substrate P, the present invention can also, be applied to a step-and-repeat type projection exposure apparatus (stepper), with which the patterns of the mask M are exposed in a batch with the mask M and the substrate P being stationary, and the substrate P is then moved successively in stepwise manner.

Also, in regard to the exposure apparatus EX, the present invention can be applied to an exposure apparatus of an arrangement, in which a reduced image of a first pattern is exposed in a batch on the substrate P by using a projection optical system (for example, a refractive projection optical system having a reduction magnification of ⅛ that does not include a reflecting element), with the first pattern and the substrate P being substantially stationary. In this case, the present invention can be also, applied to a stitch type batch exposure apparatus, in which after the reduced image of the first pattern is exposed in a batch, a reduced image of a second superimposed pattern is exposed in a batch on the substrate P in a manner that is partially overlapped with the first pattern by using the projection optical system, with the second pattern and the substrate P being substantially stationary. In regard to the stitch type exposure apparatus, the present invention can also, be applied to a step-and-stitch type exposure apparatus, in which at least two patterns are transferred onto the substrate P in a partially superimposing manner and the substrate P is moved successively.

Also, although an exposure apparatus, having the projection optical system PL, was described as an example with each of the embodiments above, the present invention can also, be applied to an exposure apparatus and an exposure method that does not use a projection optical system PL. Even in cases where a projection optical system is not used, an exposure light is illuminated onto a substrate via a mask or a lens or other optical member and an immersion region is formed in a predetermined space between such an optical member and the substrate.

The present invention can also, be applied to a twin stage type exposure apparatus, having a plurality of substrate stages, as disclosed, for example, in Japanese Patent Application Publication No. H10-163099 and Japanese Patent Application Publication No. H10-214783 (corresponding U.S. Pat. No. 6,590,634), Published Japanese Translation No. 2000-505958 of the PCT International Publication (corresponding U.S. Pat. No. 5,969,441), and U.S. Pat. No. 6,208,407.

The present invention can also, be applied to an exposure apparatus that does not have a measurement stage such as the exposure apparatus disclosed in PCT International Publication No. WO 99/49504 Pamphlet. The present invention can also, be applied to an exposure apparatus having a plurality of substrate stages and measurement stages.

Also, although in the above-described embodiments, an exposure apparatus, with which a liquid is locally filled between the projection optical system PL and the substrate P, is employed, the present invention can also, be applied to a liquid immersion exposure apparatus, with which exposure is performed with the entire top surface of the substrate to be exposed being immersed in a liquid, as disclosed for example in Japanese Patent Application Publication No. H06-124873, Japanese Patent Application Publication No. H10-303114, and U.S. Pat. No. 5,825,043.

The types of exposure apparatuses EX are not limited to exposure apparatuses for semiconductor element manufacture that expose a semiconductor element pattern onto a substrate P, and the present invention is also, widely applicable to exposure apparatuses for the manufacture of liquid crystal display elements and for the manufacture of displays, and exposure apparatuses for the manufacture of thin film magnetic heads, image pickup elements (CCD), micro machines, MEMS, DNA chips, and reticles or masks.

Although in the above-described embodiments, an optical transmission type mask, in which a predetermined light-shielding pattern (or phase pattern or dimming pattern) is formed on an optical transmission substrate, is used, instead of this mask, for example, an electronic mask (called a variable form mask; for example, this includes a DMD (Digital Micro-mirror Device), which is a type of non-radiative type image display element) for forming a transmission pattern or reflection pattern, or a light emitting pattern, based on electronic data of a pattern to be exposed as disclosed in U.S. Pat. No. 6,778,257, may be used.

Furthermore the present invention can also, be applied to an exposure apparatus (lithography system), which exposes a line-and-space pattern on a substrate P by forming interference fringes on the substrate P, as disclosed for example in PCT International Publication No. WO 2001/035168.

Moreover, the present invention can also, be applied to an exposure apparatus as disclosed for example in Published Japanese Translation No. 2004-519850 of the PCT International Publication (corresponding U.S. Pat. No. 6,611,316), which synthesizes patterns of two masks on a substrate via a projection optical system, and double exposes a single shot region on the substrate at substantially the same time using a single scan exposure.

As far as is permitted by the law of the countries specified or selected in this International Patent Application, the disclosures in all of the Japanese Patent Publications and U.S. Patents related to exposure apparatuses and the like cited in the above respective embodiments and modified examples are incorporated herein by reference.

As described above, the exposure apparatus EX of each of the embodiments of this application is manufactured by assembling various subsystems, including the respective components presented in the claims of the present application, so as to maintain the prescribed mechanical precision, electrical precision and optical precision. To ensure these respective precisions, adjustments for achieving optical precision with respect to the various optical systems, adjustments for achieving mechanical precision with respect to the various mechanical systems, and adjustments for achieving electrical precision with respect to the various electrical systems are performed before and after the assembly. The process of assembly from the various subsystems to the exposure apparatus includes mechanical connections, electrical circuit wiring connections, air pressure circuit piping connections, etc., among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Preferably, the manufacture of the exposure apparatus is performed in a clean room in which the temperature, the degree of cleanliness, etc., are controlled.

Figure 23:
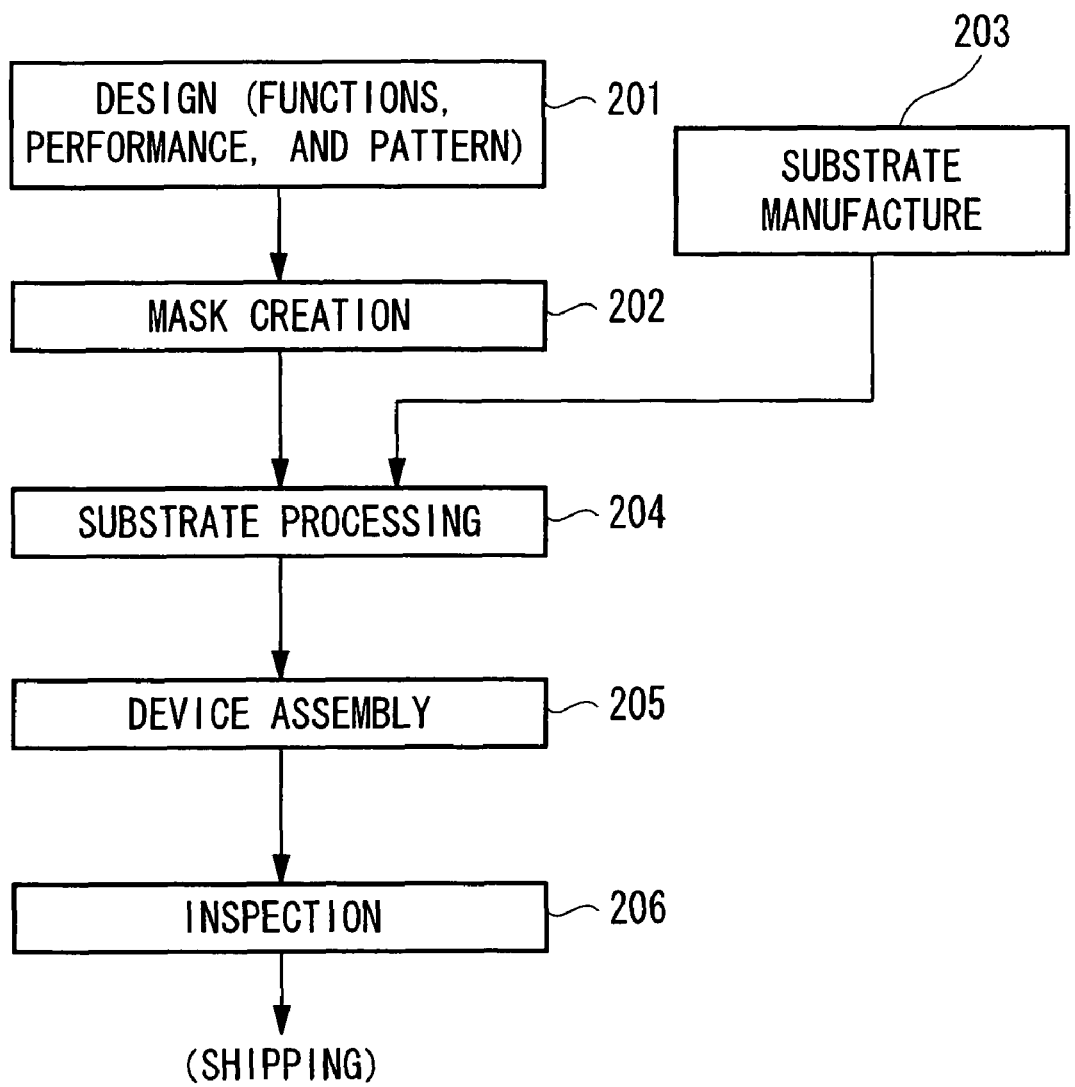
FIG. 23 is a flowchart for explaining an example of manufacturing steps for a micro device.

As shown in FIG. 23, microdevices such as semiconductor devices are manufactured through; a step 201 of performing microdevice function and performance design, a step 202 of creating the mask (reticle) based on this design step, a step 203 of manufacturing the substrate that is the device base material, a step 204 including substrate processing steps, such as a process of exposing the pattern on the mask onto a substrate by means of the exposure apparatus EX of the above-described embodiments, a process of developing the exposed substrate, and a process of heating (curing) and etching the developed substrate, a device assembly step (including treatment processes such as a dicing process, a bonding process and a packaging process) 205, and an inspection step 206, etc.

According to the present invention, a desired pattern can be formed on a substrate and a device having a desired performance can be manufactured. The present invention is thus extremely useful in an exposure apparatus and method for manufacturing a wide range of products including semiconductor elements, liquid crystal display elements or displays, thin film magnetic heads, CCDs, micro machines, MEMS, DNA chips, and reticles (masks).

The invention claimed is:

1. An exposure method, comprising:
   forming an immersion region on a substrate by supplying a liquid;
   measuring a contact time during which the liquid and the substrate are in contact;
   discarding the substrate when the contact time exceeds a tolerance value; and
   generating a notification that the contact time is about to exceed the tolerance value before the contact time exceeds the tolerance value.

2. The exposure method according to claim 1, wherein the contact time is integrated during an assisting process for recovering an error.

3. The exposure method according to claim 1, wherein the contact time includes a stationary time during which at least a portion of the immersion region is substantially stationary on the substrate.

4. An exposure apparatus which exposes a substrate via an immersion region, comprising:
   an immersion mechanism which forms the immersion region by supplying a liquid;
   a control apparatus which integrates a contact time during which the liquid and the substrate are in contact and discards the substrate when the contact time exceeds a tolerance value, wherein
      the control apparatus generates a notification that the contact time is about to exceed the tolerance value before the contact time exceeds the tolerance value.

5. The exposure apparatus according to claim 4, wherein the control apparatus integrates the contact time during an assisting process for recovering an error.

6. The exposure apparatus according to claim 4, wherein the contact time includes a stationary time during which at least a portion of the immersion region is substantially stationary on the substrate.

7. An exposure method, comprising:
   forming an immersion region on a substrate; and
   exposing the substrate via a liquid of the immersion region while moving the substrate in a first direction; wherein,
   a contact area of the immersion region with a surface of the substrate comprises a shape having opposing corners facing each other along the first direction and having the other opposing corners facing each other along a second direction which intersects with the first direction.

8. The exposure method according to claim 7, wherein the outer shape of the contact area of the immersion region with a surface of the substrate has a substantially rhomboid shape.

9. The exposure method according to claim 7, further comprising:
measuring an integration value of a contact time during which the liquid of the immersion region and a first region on the substrate are in contact; and
discarding the substrate when the integration value exceeds a predetermined tolerance value.

10. The exposure method according to claim 7, wherein the substrate is held at a recess portion on a movable member which is enabled to move while holding the substrate, and a surface of the substrate which is held by the recess portion and an upper surface of the movable member are substantially at an equal height.

11. The exposure method according to claim 7, further comprising:
moving the immersion region from the substrate onto a second movable member by making the second movable member that differs from a movable member and the movable member be in contact or be close to each other, in which the substrate is held by a recess portion on the movable member which is enabled to move while holding the substrate.

12. An exposure method, comprising:
forming an immersion region on a substrate; and
exposing the substrate via a liquid of the immersion region while moving the substrate in a first direction; wherein,
a contact area of the immersion region with a surface of the substrate comprises a substantially polygonal shape having a line element between adjacent vertexes, the line element intersecting obliquely with the first direction.

13. The exposure method according to claim 12, wherein the substantially polygonal shape has a substantially rhomboid shape.

14. The exposure method according to claim 12, further comprising:
measuring an integration value of a contact time during which the liquid of the immersion region and a first region on the substrate are in contact; and
discarding the substrate when the integration value exceeds a predetermined tolerance value.

15. The exposure method according to claim 12, wherein the substrate is held at a recess portion on a movable member which is enabled to move while holding the substrate, and a surface of the substrate which is held by the recess portion and an upper surface of the movable member are substantially at an equal height.

16. The exposure method according to claim 12, further comprising:
moving the immersion region from the substrate onto a second movable member by making the second movable member that differs from a movable member and the movable member be in contact or be close to each other, in which the substrate is held by a recess portion on the movable member which is enabled to move while holding the substrate.

17. An exposure apparatus that exposes a substrate via a projection optical system and an immersion region, comprising:
a movable member that is enabled to move in a first direction while holding the substrate; and
an immersion mechanism that forms the immersion region between the substrate and the projection optical system by supplying a liquid to an image plane side of the projection optical system; wherein,
a contact area of the immersion region with a surface of the substrate comprises a shape having opposing corners facing each other along the first direction and having the other opposing corners facing each other along a second direction which intersects with the first direction.

18. The exposure apparatus according to claim 17, wherein the outer shape of the contact area of the immersion region with the surface of the substrate has a substantially rhomboid shape.

19. The exposure apparatus according to claim 17, wherein the immersion region is locally formed on the substrate.

20. The exposure apparatus according to claim 17, further comprising:
a control apparatus that measures an integration value of a contact time during which the liquid of the immersion region and a first region on the substrate are in contact.

21. The exposure apparatus according to claim 20, wherein a plurality of shot regions set on the substrate are exposed successively, and the first region comprises at least a partial region of at least one of the plurality of shot regions.

22. The exposure apparatus according to claim 20, wherein the control apparatus controls operations of the immersion mechanism such that the integration value does not exceed the tolerance value.

23. The exposure apparatus according to claim 17, wherein the substrate is held inside of a recess portion of the movable member, and a surface of the substrate which is held inside of the recess portion and an upper surface of the movable member are substantially at an equal height.

24. The exposure apparatus according to claim 17, further comprising:
a second movable member that differs from the movable member;
wherein,
moving the immersion region from the substrate onto the second movable member by making the second movable member and the movable member be in contact or be close to each other, in which the substrate is held by a recess portion on the movable member which is enabled to move while holding the substrate.

25. An exposure apparatus that exposes a substrate via a projection optical system and an immersion region, comprising:
a movable member that is enabled to move in a first direction while holding the substrate; and
an immersion mechanism that forms the immersion region between the substrate and the projection optical system by supplying a liquid to an image plane side of the projection optical system;
wherein,
a contact area of the immersion region with a surface of the substrate comprises a substantially polygonal shape having a line element between adjacent vertexes, the line element intersecting obliquely with the first direction.

26. The exposure apparatus according to claim 25, wherein the substantially polygonal shape has a substantially rhomboid shape.

27. The exposure apparatus according to claim 25, wherein the immersion region is locally formed on the substrate.

28. The exposure apparatus according to claim 25, further comprising:
a control apparatus that measures an integration value of a contact time during which the liquid of the immersion region and a first region on the substrate are in contact.

29. The exposure apparatus according to claim 28, wherein a plurality of shot regions set on the substrate are exposed successively, and the first region comprises at least a partial region of at least one of the plurality of shot regions.

30. The exposure apparatus according to claim 28, wherein the control apparatus controls operations of the immersion mechanism such that the integration value does not exceed a tolerance value.

31. The exposure apparatus according to claim 25, wherein the substrate is held inside of a recess portion of the movable member, and a surface of the substrate which is held inside of the recess portion and an upper surface of the movable member are substantially at an equal height.

32. The exposure apparatus according to claim 25, further comprising:
   a second movable member that differs from the movable member;
wherein,
   moving the immersion region from the substrate onto the second movable member by making the second movable member and the movable member be in contact or be close to each other, in which the substrate is held by a recess portion on the movable member which is enabled to move while holding the substrate.

33. A device manufacturing method that employs the exposure apparatus according to claim 17.

34. A device manufacturing method that employs the exposure apparatus according to claim 25.

* * * * *